United States Patent [19]

Engelmann et al.

[11] Patent Number: 4,673,888

[45] Date of Patent: Jun. 16, 1987

[54] POWER CONTROL SYSTEM

[75] Inventors: Rudolph H. Engelmann, Ann Arbor; Thad Early, Niles, both of Mich.

[73] Assignee: Electro-Voice, Inc., Buchanan, Mich.

[21] Appl. No.: 903,288

[22] Filed: Sep. 2, 1986

[51] Int. Cl.⁴ .............................................. H03F 3/38
[52] U.S. Cl. ..................................... 330/10; 323/301; 363/17; 363/43
[58] Field of Search .................... 363/17, 43; 323/301, 323/247, 328; 330/10

[56] References Cited

U.S. PATENT DOCUMENTS

| | | | |
|---|---|---|---|
| 4,011,499 | 3/1977 | Betsill et al. | 323/301 |
| 4,052,658 | 10/1977 | Hucker | 363/43 |
| 4,164,714 | 8/1979 | Swanson | 330/10 |

FOREIGN PATENT DOCUMENTS 64520  4/1983  Japan ................................. 323/301

Primary Examiner—William H. Beha, Jr.
Attorney, Agent, or Firm—Darby & Darby

[57] ABSTRACT

A power supply for providing an output voltage amplitude modulated by a command signal, includes a rectifier for rectifying the command signal, a comparator network for comparing the instantaneous rectified level of the command signal with a plurality of predetermined reference voltages, for producing a plurality of phasing signals, respectively, for operating a switching network to (1) alternately and successively connect positive and negative polarity DC voltages to the one ends of a primary windings of a plurality of transformers, and to (2) connect either the positive or the negative DC voltage to the other ends of the primary windings in different combinations, over each half-cycle of a clock signal, for producing in a common secondary winding for the transformers the amplitude modulated output voltage. Another rectifier may be provided for rectifying the AC output voltage, for producing a DC output voltage amplitude modulated by the command signal.

17 Claims, 14 Drawing Figures

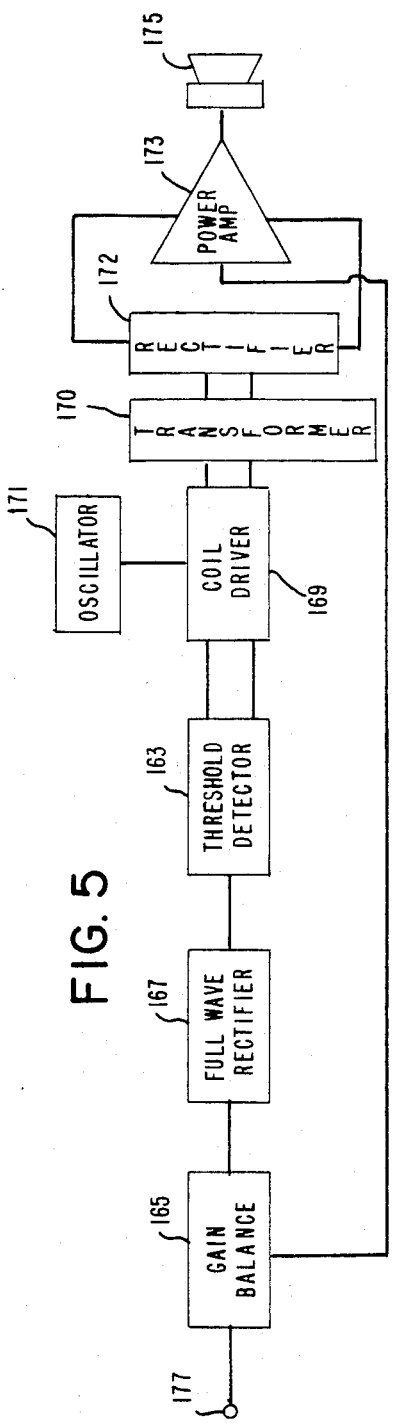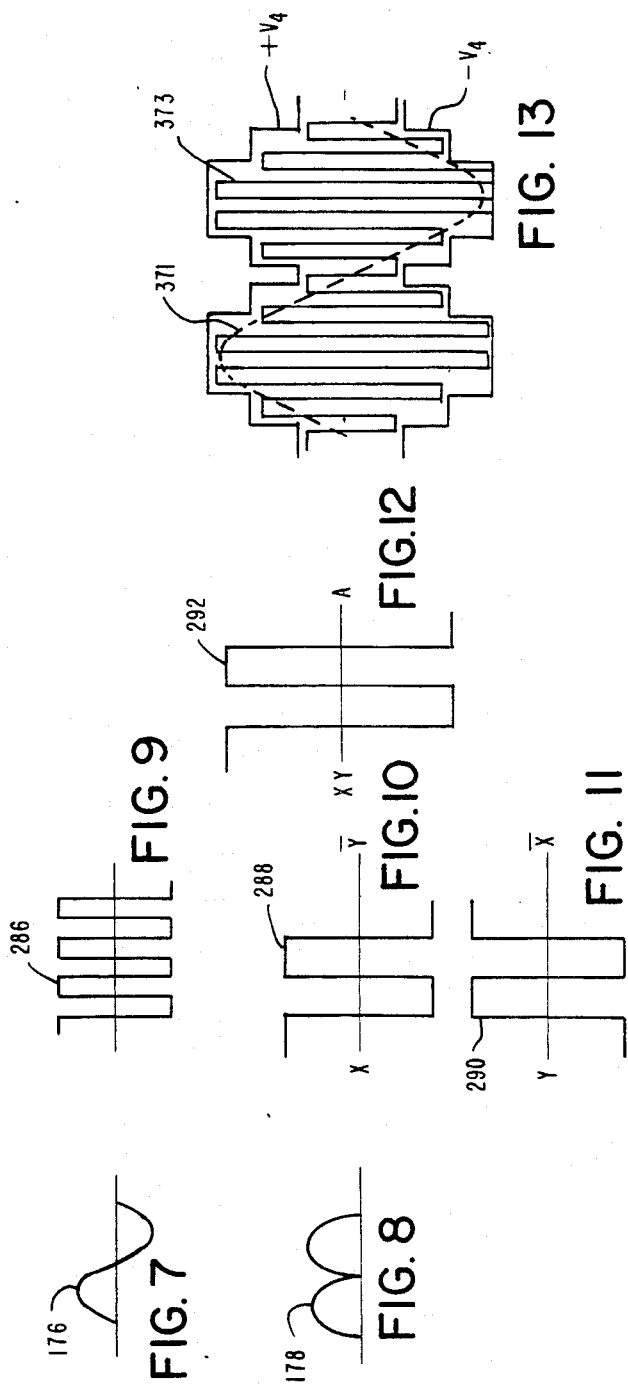

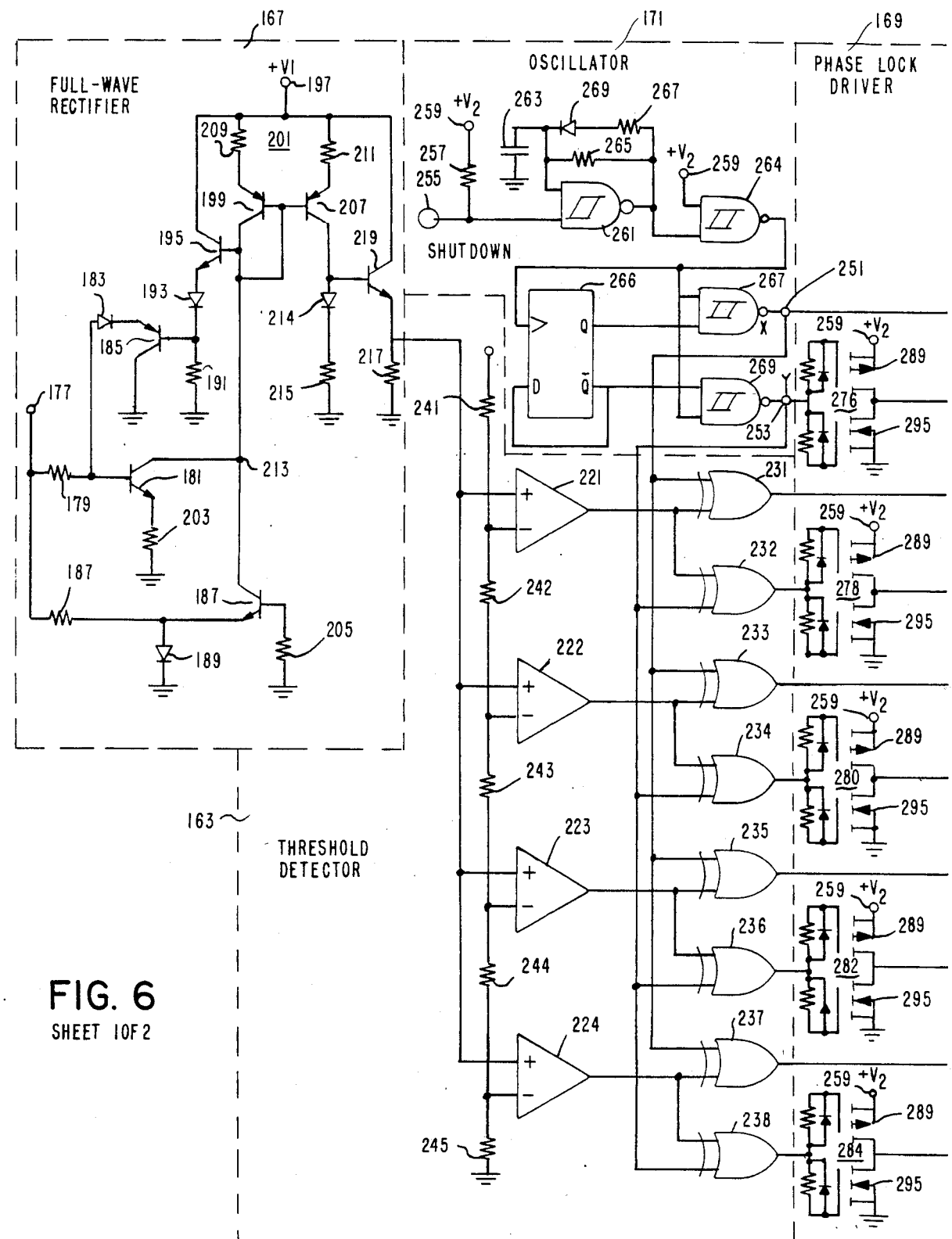

POWER CONTROL SYSTEM

CROSS REFERENCE TO RELATED APPLICATION:

This application is related to co-pending Ser. No. 902,934, of Rudolph H. Engelman, filed on Sept. 2, 1986, for "POWER CONTROL SYSTEM", and having the same assignee as the present application.

FIELD OF THE INVENTION

The field of the present invention relates generally to power supplies, and more specifically to digitally-controlled power conversion apparatus.

BACKGROUND OF THE INVENTION

Known apparatus for providing voltage and/or current regulation comprise various schemes for exploiting the series drop of unwanted or excess voltage. Examples are the parallel shunting of excess currents, often in combination with a series voltage drop; apparatus such as switching converters for exploiting the frequency modulation of a train of constant width pulses, or the pulse width modulation of pulses maintained at a constant frequency; and other apparatus include resonant and ferroresonant and similar types of devices. All of these known apparatus have one or more drawbacks or detriments, such as severe constraints of efficiency, reliability, size, weight, cost, and so forth. Switching power supplies employing pulse width modulation are limited by the transformers necessary for their operation having relatively narrow bandpass. Also, pulse width modulated (PWM) supplies produce a modulated frequency at relatively light demand loads, at times requiring some minimum low level load to be permanently installed in the power supply for affording proper operation. In such known PWM supplies, sometimes 20% or more of the power is wasted due to the maintenance of a light load in the power supply at all times. Also, PWM supplies are very complex. Another known supply, a linear supply, is relatively inefficient in volume, weight, and power transfer. A 40% transfer efficiency at high line input voltage is considered relatively good for typical linear supplies, such as those used for supplying power to five-volt digital logic, for example.

SUMMARY OF THE INVENTION

An object of this invention is to provide a very high efficiency power supply.

Another object of this invention is to provide a digitally-controlled power converter apparatus operating at a constant frequency, with a constant pulse-width switching topology.

Another object of the invention is to provide a power converter having pulse by pulse management of the transformer turns ratio for matching either the power supply voltage, or current, or power output to either a constant or variable input command signal, for output load.

Another object of the invention is to provide a power converter capable of providing a power output waveform that is analogous to a command or demand control signal.

Another object of the invention is to provide a power converter that is highly efficient, and provides constant matching of the power line to the load.

Still another object of the invention is to provide a very efficient power conversion apparatus in a relatively small volume for uses including battery charging, powering audio amplifiers, and so forth.

Another object of the embodiment of the invention for battery charging, is to provide an improved end of charge detection circuit for terminating the battery charging.

Another object of the invention is to provide a power converter that is free of loop control subsystems requiring the use of complex servo equations.

Another object of the invention is to provide a power converter of improved design having high stability, and reproducability, with the ability to provide relatively high levels of output power.

With these and other objects in mind, and also in view of the problems in the prior art, the present improved power converter includes switching means for controlling voltage or current in either the primary or secondary circuits of a plurality of interconnected transformers, by placing the primary or secondary windings of the transformers into various configurations where one or more of the windings at a given time have their voltages additive in the total circuit, and at other times have their volts per turn reduced from the total circuit via shorting of a particular one or more of the transformers, thereby selectively controlling the output voltage or current and power provided from the combination of the transformers, and further includes means for controlling the switching means in accordance with an input command or demand signal, for producing a desired power output AC or DC voltage or current, or a desired limit on input power or current.

BRIEF DESCRIPTION OF THE DRAWINGS

The various embodiments of the present invention will be described with reference to the following drawings in which like items are indicated by the same reference numbers:

FIG. 5 is a generalized block diagram of yet another embodiment of the invention.

FIGS. 7 through 12 show various waveforms, for purposes of illustration of various embodiments of the invention.

FIG. 13 shows a composite waveform associated, for example, with various embodiments of the invention.

DESCRIPTION OF THE PREFERRED EMBODIMENTS OF THE INVENTION

Figure 1:
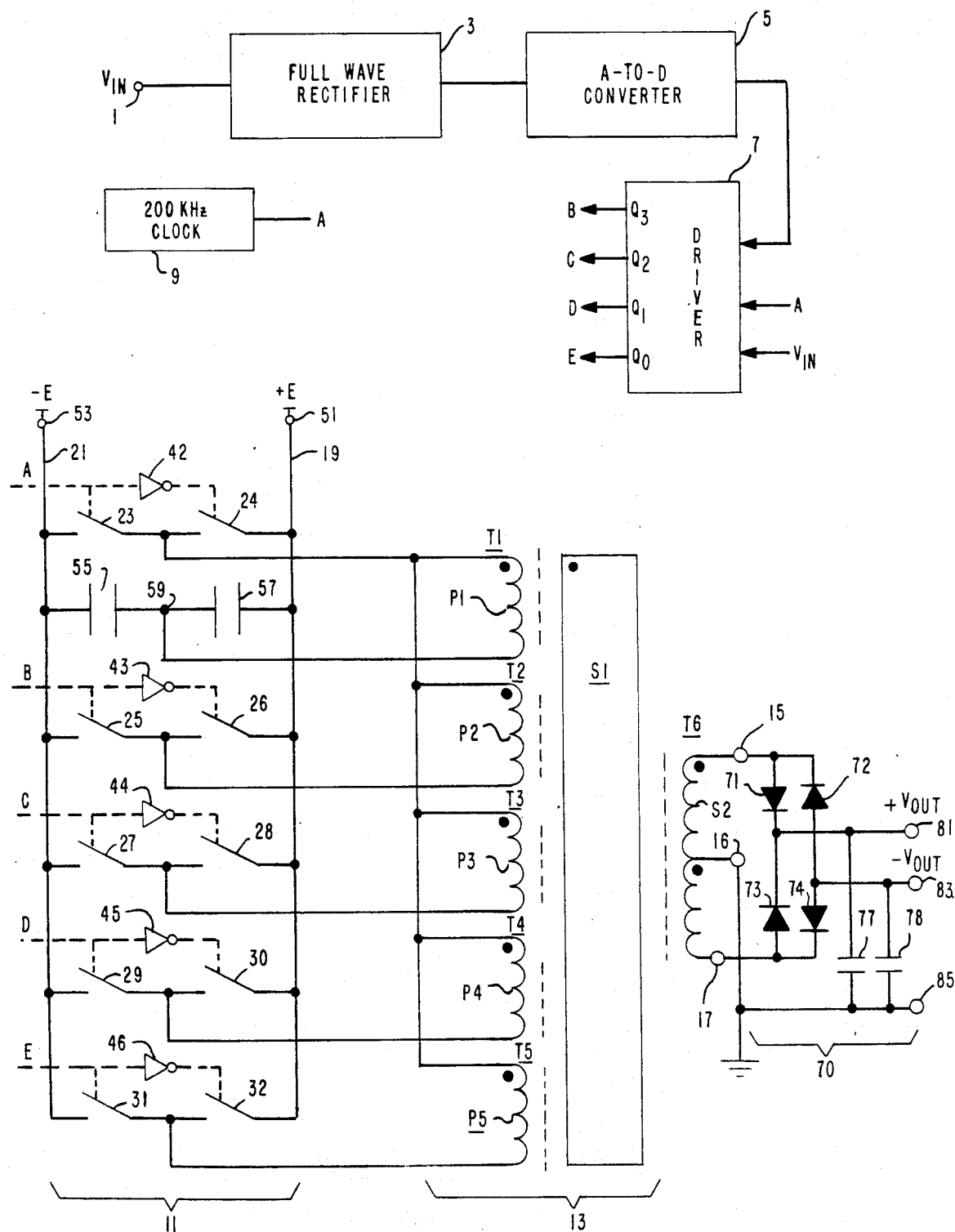
FIG. 1 is a block/schematic diagram of one embodiment of the invention.

With reference to FIG. 1, a simplified block schematic diagram is shown of one embodiment of the present invention for providing an amplitude modulated power supply. An input signal or waveform, such as for example an audio input waveform or a signal representing the magnitude of line input current being drawn to charge a bank of batteries, is rectified by a full-wave rectifier 3. An analog-to-digital converter (A-to-D) 5 converts the full-wave rectified input signal to a digital representation thereof. This digitized input or control signal is supplied to a driver 7, which also receives a clock signal A, and the input signal $V_{IN}$ from input terminal 1. A clock signal is provided by a clock oscillator 9, in this example operating at 200 kilohertz, for providing a clock switch-drive signal A. The clock signal A is also provided to the driver 7. The driver 7 provides as output signals, switching signals B, C, D, and E, which signals are either at a binary "1" or binary "0", to form a binary value which is proportional to the instantaneous amplitude.

A switching network 11 is coupled to the primary windings P1 to P5 of five transformers T1 through T5, respectively, which share a common secondary S1, in this example. The switching network 11 is controlled by driver 7, which effects the volts per turn of the secondary winding S1, as will be described in detail below. As the volts per turn of the secondary winding S1 is either reduced or unaffected, the energy from this winding is coupled to, in this example, a sixth transformer T6 as the secondary $S_1$ becomes or serves as a primary winding for transformer T6 for providing an output signal across terminals 15 and 17 that is a discrete approximation (See FIG. 14) of the input signal provided at input terminal 1. The operation of the circuit of FIG. 1 will now be described in greater detail.

The switching network 11 includes in series connection between a positive voltage rail 19 and a negative voltage rail 21, a first pair of switches 23, 24, a second pair of switches 25, 26, a third pair of switches 27, 28, a fourth pair of switches 29, 30, and a fifth pair of switches 31, 32, each being shown for the sake of simplicity as a single pole single throw normally open switch. Note that the switches 23 through 32 are each in practice typically provided by a solid-state switch or a switching circuit including power MOSFETS, for example, as will be described in greater detail below.

Inverters 42 through 46 are shown connected between each individual pair of switches 23 and 24, 25 and 26, 27 and 28, 29, and 30, and 31 and 32, respectively. Assume that each one of the switches 23 through 32 are turned on by a binary "1" signal, and turned off by a binary "0" signal. Note also that the positive rail 19 is connected to a power supply terminal 51 for receiving a positive voltage +E, and the negative rail 21 is connected to a power terminal 53 for receiving a negative voltage −E. Two capacitors 55 and 57 are included between the positive rail 19 and negative rail 21 in series as shown for providing an AC common at their common connection point 59. Note that one end of primary winding $P_1$ is connected to this AC common point 59. Also note that the first pair of switches 23, 24 are alternately switched on and off via the application of clock-pulse signal A to the switches 23, 24. In this example, when the clock signal is "high", that is a binary "1", a positive control signal is applied to switch 23 for closing that switch, whereas a "0" signal (inversion of clock pulse) is applied via inverter 42 to switch 24, keeping the latter turned off or in an open-circuit condition. Alternatively, when the clock pulse signal falls to "0", switch 23 is turned-off, and inverter 42 causes the digital "0" clock-pulse signal to be inverted to a binary "1" binary for turning on switch 24 (closing switch 24). Accordingly, one end of the primary winding $P_1$ is switched between the +E and −E supply voltages at a 200 kilohertz switching rate, for in this example providing an "idle" output voltage between output terminals 15 and 17, regardless of the amplitude or even presence of a command or input control signal at input terminal 1. The amplitude of this "idle" output voltage is dependent upon the turns ratio between the windings of T6. The winding $S_1$ is a high current, low voltage, single turn winding, in this example, which serves as a secondary for T1 through T5, and as a primary winding for T6.

Assume that the input signal $V_{IN}$ is a sinusoidal voltage. Also assume that the switching signals B, C, D, and E, represent the "least" to "most" significant bits of a binary progression of a digital measurement of the instantaneous amplitude of the input waveform $V_{IN}$. In this example a resolution of four binary bits is used. Based upon the instantaneous amplitude of the command or input waveform $V_{IN}$, the driver 7 provides the control signals B, C, D, and E either in phase with the clock signal A, or 180° out of phase with the clock signal A. For example, when the amplitude of the command or input signal $V_{IN}$ at terminal 1 is at "0" volt, only the idle voltage provided by the alternate operation of switches 23 and 24 is provided between output terminals 15 and 17. At such times of "0" volt input signal, driver 7 provides the switching signals B, C, D, and E in phase with the clock signal A, thereby causing switches 25, 27, 29, and 31 to be in a closed condition (conductive), whenever switch 23 is closed, in turn causing the associated primary windings P2 through P5, to be connected to the negative rail 21, thereby leaving little or no voltage drop across primary windings P2 through P5. When switch 23 opens, and switch 24 closes, control signals B, C, D, and E are changed from a binary "1" or "high" condition to a binary "0" or "low" condition, thereby closing switches 26, 28, 30 and 32, causing windings P2 through P5 to be connected to positive rail 19, to effectively maintain an insignificant instantaneous voltage drop across primary windings P2 through P5.

When the sinusoidal input signal $V_{IN}$, in this example, attains its maximum encodable amplitude, the driver 7 will operate to cause the signals B, C, D, and E to all be "high" and 180° out of phase with the clock signal A. Accordingly, whenever switch 24 is closed, switches 25, 27, 29, and 31 will also be closed, causing the rail's voltage 19 and 21 to be applied across the primary windings P1 through P5, whereby their volts per turn is maximum cumulative to secondary S1 which is the primary winding for T6. Maximum volts per turn is thereby induced in the secondary winding S2 of T6 causing an AC waveform to appear across terminals 15 and 17. A centertap of winding S2 allows this AC signal to be full-wave rectified to provide two DC voltages, one positive, one negative, with respect to a common at terminal 85 which returns load current to centertap 16. Diodes 71 through 74 rectify the current available from winding S2, to develop the DC voltages $+V_{out}$ and $-V_{out}$ at terminals 81 and 83, respectively, measured from common terminal 85. On the next half-cycle of the clock signal A, switch 24 will open and switch 23 will close, correspondingly switches 25, 27, 29, 31 will open, and switches 26, 28, 30, and 32 will close, which will maintain the additive contributions of primaries P2 through P5, but reversing the flow of current therethrough, while retaining the phase relationship between the switches. Assuming the frequency of the sinusoidal input waveform in this example is substantially lower than the 200 kilohertz clock signal A, the transformers T2 through T5 will be switched in the same or different combinations into and out of the transformer set 13 at a 200 kilohertz switching rate as long as the sinusoidal waveform stays below a peak value that causes the driver 7 to provide the output switching signals B, C, D, and E, in binary combinations of "1" and "0" which summarily correspond to instant voltage levels of $V_{IN}$. As the sinusoidal waveform reduces in amplitude towards the "0" crossover point, the digital signal from the analog-to-digital converter 5 will correspondingly reduce in value in steps, causing a corresponding change in the combination of high and low levels of the control signals B, C, D, and E, causing different combinations of the primary windings P2, P3, P4, and P5, to be effectively switched into and out of the transformer set 13; thus causing discrete reductions in the level of the output voltage appearing across output terminals 15 and 17. Note that in this example, a full-wave rectifier 70 is provided including diodes 71 through 74, and capacitors 77 and 78, for rectifying the output AC waveform to provide a positive and negative DC voltage at terminals 81 and 83, relative to common terminal 85. The turns ratio between the windings of transformers T1 through T6 can be adjusted for controlling the level of the output voltage produced across terminals 15 and 17 in response to the control signals A, B, C, D, and E, and correspondingly the level of the DC output voltage provided at terminals 81, 83, and 85. As will be described in greater detail below, the illustrated amplitude modulated power supply embodiment of this invention is applicable for use as an amplitude modulated DC output power supply for an audio amplifier, where the level of the DC output voltages are made to track the level of the audio input signal, which in this example would be coupled to input terminal 1. In this manner, a highly efficient, well-regulated, and very compact DC power supply is provided for an audio amplifier. Also, as will be shown, the basic system of FIG. 1 can be modified for providing a current source for charging batteries.

With further reference to FIG. 1, as described above, for an AC input signal applied to terminal 1, the amplitude of the AC output voltage developed across terminals 15 and 17 will vary in correspondence to the amplitude of the instantaneous amplitude of the AC input signal. As previously explained, the absolute amplitude of the output AC waveform will depend upon the level of the DC voltage applied to the negative and the positive rails 21, 19, respectively, and the turns ratio between the primary windings S2 of transformer T6. The system of FIG. 1 can also be modified to perform as a variable output transformer by manually controlling the amplitude of the AC input signal applied to terminal 1, for obtaining a modulated output signal across terminals 15 and 17 of some desired envelope amplitude, or for obtaining some desired levels of DC voltage between terminals 81, 83, and 85.

Figure 2:
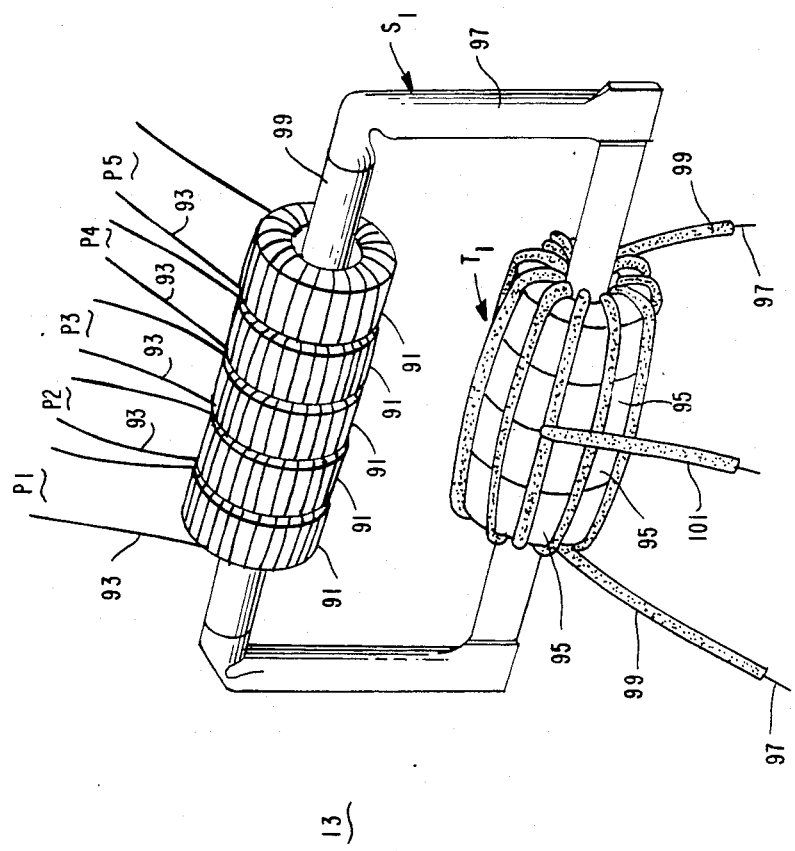
FIG. 2 is a pictorial diagram of a toroid transformer of one embodiment of the invention.

With reference to FIG. 2, the toroidal transformer set 13 is provided in one embodiment by individual toroids 91, each including a winding of copper wire 93, for example, each winding being of a predetermined number of turns, for providing the primary windings P1 through P5, respectively, as shown. The secondary winding S1 is provided by a one-turn or closed loop of copper tubing 97, a portion of which is inserted through the stacked array of toroids 91, as shown. The portion of the copper tubing 97 enclosed by the toroids 91 is covered by heat shrink insulation 99, as shown. The opposing side of the copper tubing 97 from the toroids 91 is inserted as a primary winding through a stack of toroids 95, as shown. Tinned and braided copper wire 97 covered by heat shrink insulation 99 is wound about the stack of toroids 95, as shown. The toroid stack 95 can be replaced by a single cylindrical core. A centertap 101 is provided as shown. In this manner, the secondary winding S2 of transformer T6 is provided, to which S1 serves as the primary winding.

Figure 3:
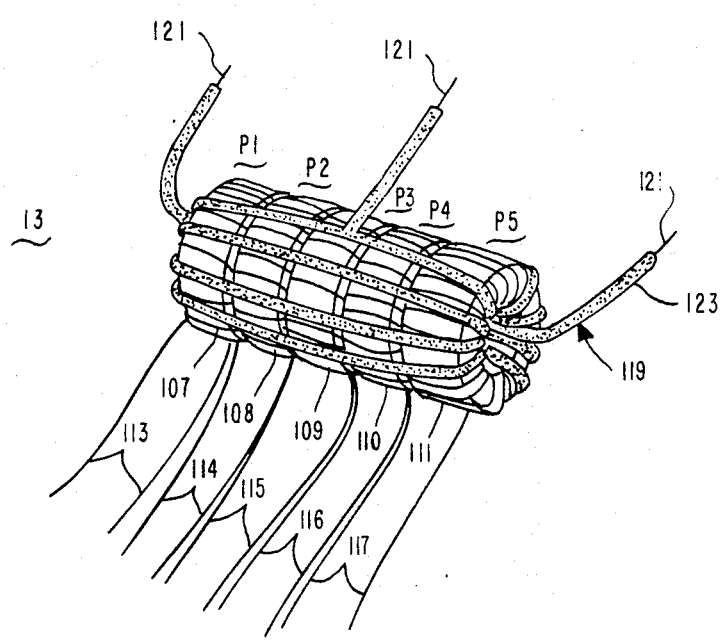
FIG. 3 is a pictorial diagram of a toroid transformer of another embodiment of the invention.

In another embodiment of the invention, the transformer 13 is provided as shown in FIG. 3. In this alternative embodiment, the secondary/primary winding S1 formed by the copper tubing 97 in the embodiment of FIG. 2 has been eliminated. In this example, five toroids 107 though 111 are individually wound with a predetermined number of turns of copper wire 113 through 117, respectively, for providing the primary windings P1 through P5, respectively. The winding S1 being eliminated, eliminates the cores 95, leaving single-stage induction from primary winding 93 to secondary winding 97, for which a centertap 125 is provided as shown. Note that in both embodiments for the transformer set 13 shown in FIGS. 2 and 3, the cores 91, 95, and 107-111, respectively, were ferroxcube 3C8 ferrite toroids manufactured by Ferroxcube, Inc. U.S.A. Note that the transformers include litz wire 121, and insulation 123.

Figure 4:
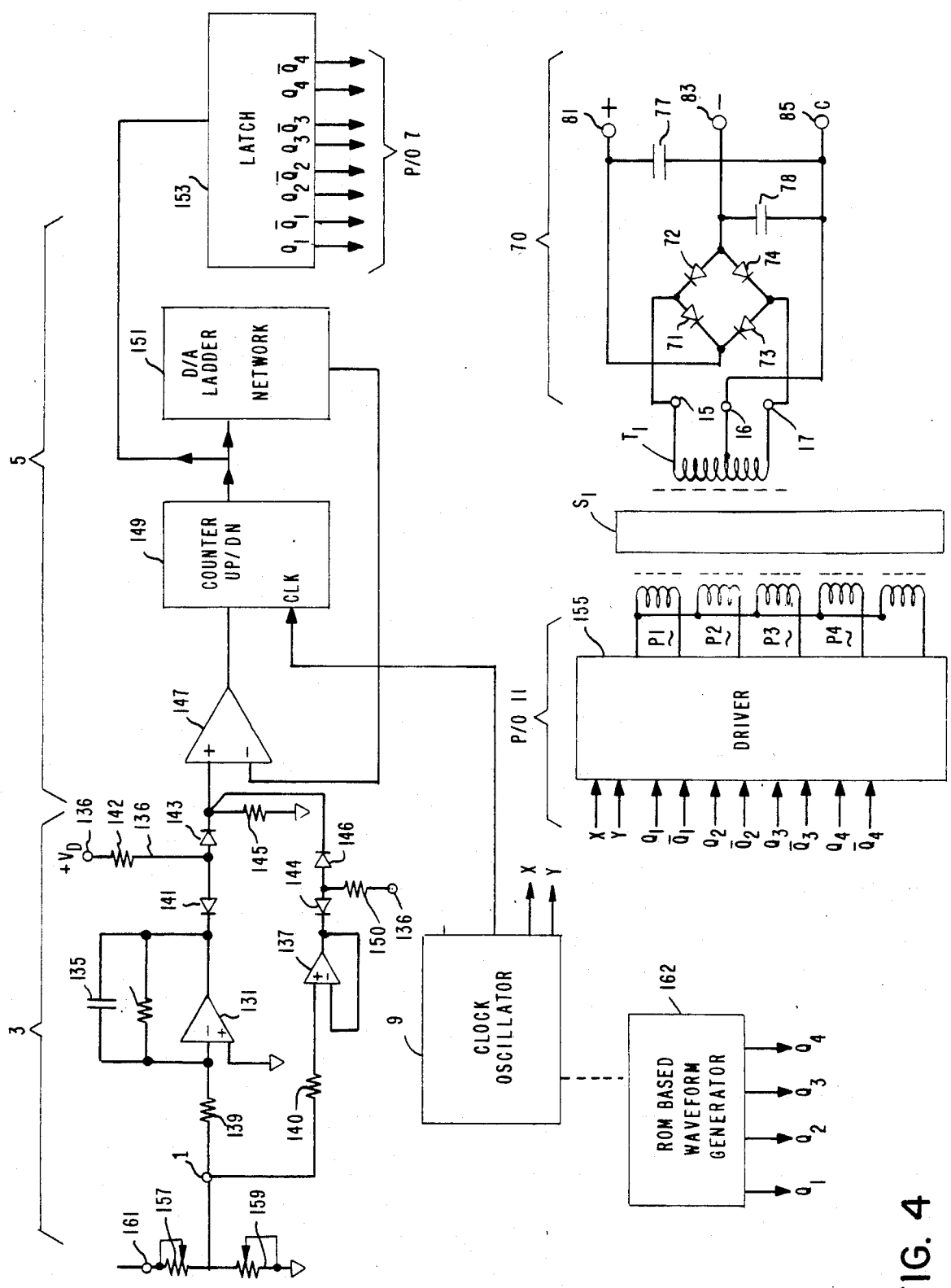
FIG. 4 is a simplified block/schematic diagram showing additional details of the embodiment of the invention of FIG. 1.

The embodiment of the invention shown in FIG. 1, has portions thereof shown in FIG. 4 for illustrating a practical implementation of the embodiment of FIG. 1. The full-wave rectifier 3 includes a precision rectifier consisting of an operational amplifier 131, connected as an inverting voltage amplifier with a resistor 133 and capacitor 135 connected in parallel between the inverting input terminal and output terminal of the amplifier 131. The command or demand input signal applied to input terminal 1 is connected via a resistor 139 to the inverting input terminal of amplifier 131. Note that the non-inverting input terminal of operational amplifier 131 is connected to a logic or signal common, in this example. Diodes 141 and 143 and resistor 142 are connected as shown between the output terminal of amplifier 131 and a resistor 145, with the common connection between the anodes of diodes 141 and 143 connected via resistor 142 to $+V_D$ via terminal 36, for imposing the rectified output voltage across resistor 145. A voltage follower amplifier 137 is connected from its non-inverting terminal to input terminal 1 via resistor 140, for receiving the command signal input signal, and has its output and inverting input terminals directly connected together. A diode 144 has its cathode electrode connected to the output of amplifier 137, and its anode connected via resistor 150 to terminal 136, and to the anode of diode 146, the latter having its cathode connected to common connection of the cathode of diode 143 and resistor 145.

The A-to-D converter 5 is provided by a comparator 147, and up/down counter 149, and a digital to analog (D/A) ladder network 151, as shown. The comparator 147 is connected from its non-inverting input terminal to resistor 145 for receiving the rectified input voltage from the precision rectifier 3. The inverting terminal of comparator 147 is connected to an output of the D/A network 151. The output of comparator 147 is connected to the UP/DOWN input terminal of the counter 149. A clock oscillator 9 provides a clock signal to the CLK terminal of counter 149, in this example. The binary encoded output from counter 149 is connected to a latch 153, which responds by producing the complementary pairs of driver control or input signals $Q_1$, $\overline{Q}_1$, through $Q_4$, $\overline{Q}_4$, respectively, as shown. The latter signals are provided to a switching network corresponding to switching network 11 of FIG. 1, but including switching circuits (not shown) responsive to the complementary pairs of control signals from the latch 153. The driver 155 also receives a pair of clock signals shown as X and Y, to which it responds to provide the idle voltage as previously discussed for the embodiment of FIG. 1. The driver 155 provides the same function as the switches 23 through 32, and inverters 42 through 46, of FIG. 1, for selectively connecting transformers T2–T5, respectively. Otherwise, the embodiment of FIG. 4 operates substantially in the same manner as described for the embodiment for FIG. 1. Resistor 157 and variable resistor 159 provide a variable voltage divider for applying the input signal to terminal 1. The common connection between the variable resistor 159 and fixed resistor 157 is shown in phantom connected to signal input terminal 1. If the command or demand signal is a sinusoidal waveform of fixed amplitude, for example, the embodiments of FIGS. 5, 4, and FIG. 1, can each serve as variable transformers. Assume that the fixed amplitude sinusoidal input signal is applied to terminal 161 of the voltage divider 157, 159, connected as shown. By changing the resistance of the variable resistor 159, manual control of the AC output voltage developed across terminals 15 and 17 is obtained. It is in this manner that the embodiments of FIGS. 1 and 4 provide a manually variable transformer which affords voltage regulation, and electrical isolation between the sinusoidal input signal applied to terminal 161 and the voltage output terminals 15 and 17. Regulation and electrical isolation between input and output are features that are not provided by variacs, or other versions of variable autotransformers. Also as shown in phantom connection, the digitized AC command waveform or signal can be provided internally via a ROM based waveform generator 162, for example. If a ROM based waveform generator 162 is so used, the rectifier 3, and A-to-D converter 5, are not required, and the magnitude of the ROM 162 generated waveform is controlled internally of ROM 162 by a manually set binary subtrahend added to the ROM 162 value; the outputs of the adder then being fed to the input of latch 153 for providing a modulated output voltage across terminals 15 and 17. The ROM based waveform generator 162 contains a binary adder which receives a ROM data as a minuend and externally determined binary subtrahends, the outputs of the adder being connected to the inputs of the latch 153.

Figure 6:
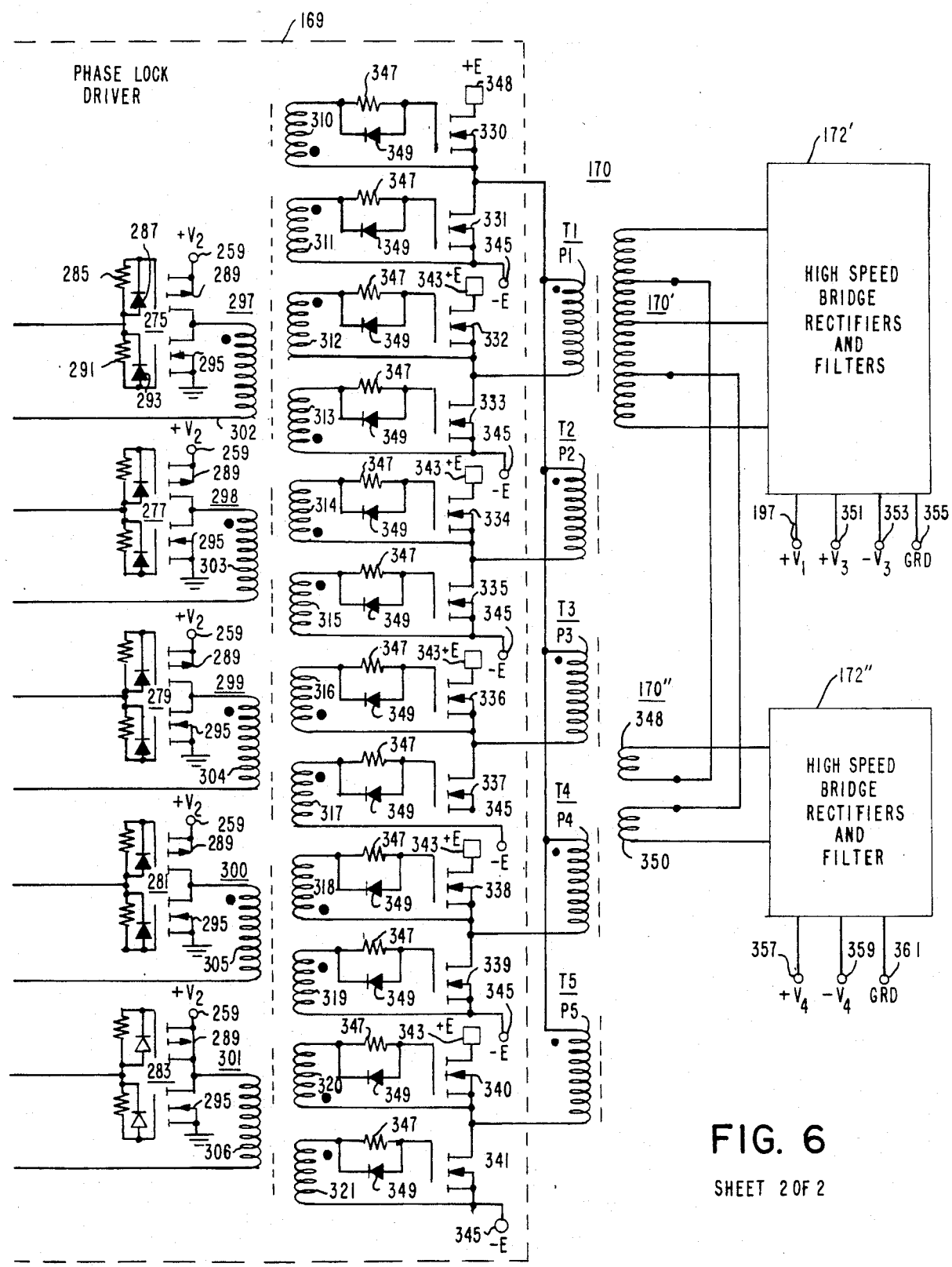
FIG. 6 is a detailed circuit/logic schematic diagram of a major portion of the embodiment of the invention of FIG. 5.

In yet another embodiment of the invention as shown in FIGS. 5 and 6, the counting scheme of FIG. 4 (147, 149, 151, and 153) has been eliminated in favor of a threshold detector scheme 163. In this manner, resolution is sacrificed for speed, in order to have the level of the DC output voltage from the present amplitude modulated power supply track all of the rapid excursions of an audio input signal. As shown in FIG. 5, this embodiment of the invention as included in an audio system, consists of a gain balance control circuit 165, for permitting manual adjustment of the gain of the system; a full wave rectifier 167; a threshold detector 163; a phase lock driver network phase lock driver 169; an oscillator or clock 171; and a rectifier 171 having an output supplying amplitude modulated DC voltages to an audio power amplifier 173, for driving a loudspeaker 175. Note that an audio signal applied to input terminal 177 is distributed from the gain balance network 165 to both the full-wave rectifier 167, and to the power amplifier 173. However, in practice, the amplitude of the audio signal provided to the rectifier 167 may be different from the amplitude of the audio signal provided to the power amplifier 173.

With further reference to FIGS. 5 and 6, the full-wave rectifier 167 receives the gain controlled audio signal at terminal 177, as provided by the gain balance control 165. Note that the gain balance control 165 can be provided by simple voltage divider networks (not shown), including variable resistors for manual adjustment of the signal directly provided to power amplifier 173, independently from adjustment for the amplitude of the audio signal supplied to the rectifier 167.

The full-wave rectifier 167 includes a first input resistor 179 for coupling the input signal from input terminal 177 to the base electrode of NPN transistor 181, and via a diode 183 to the emitter electrode of PNP transistor 185. Another input resistor 187 is connected between the input terminal 177 and the common connection of the emitter electrode of an NPN transistor 187, and the anode of a diode 189. The base electrode of PNP transistor 185 is connected to the common connection of a resistor 191 and the cathode of a diode 193, the transistor having its collector electrode connected to ground. The anode electrode of diode 193 is connected to the emitter electrode of an NPN transistor 195, the latter also having a collector electrode terminated to a voltage terminal 197 for receiving $+V_1$ volts, and a base electrode connected to the collector electrode of PNP electrode 199, included in a current mirror amplifier 201.

The circuit including the combination of diodes 183 and 193, transistors 185 and 195, and resistors 179 and 191, function to eliminate interference caused by an audio signal connected to input terminal 177 having voltage exertions exceeding the level of the rail voltage $+V_1$, thereby insuring a stable DC output voltage.

Transistor 181 has its emitter electrode connected to ground via resistor 203, and its collector electrode connected in common to the collector electrodes of transistors 187 and 199. The combination of circuit elements of transistors 181, and resistor 203, function to pass positive going signals associated with the audio input signal connected to terminal 177, the passed signals appearing as inverted signals at the collector of transistor 181.

A resistor 205 is connected between the base electrode of transistor 187 and ground. The function of this transistor circuit is to pass negative going portions of the audio input signal in a non-inverting manner. The non-inverted negative going audio signals are outputted at the collector of transistor 187. Note that diode 189 prevents excessive negative excursions of the audio input signal from being passed by the transistor 187.

Current mirror amplifier 201 includes a PNP transistor 207 having a base electrode connected in common to the base and collector electrodes of transistor 199, a resistor 209 connected between voltage terminal 197 and the emitter electrode of transistor 199, and another resistor 211 connected between terminal 197 and the emitter electrode of transistor 207. The current mirror amplifier 201 further includes transistors 197 and 207, and associated elements, and functions to reference to ground the full-wave audio signal appearing at the connection point 213. Note that the positive and negative going portions of the audio signal passed by transistors 181 and 187 are combined into a full-wave rectified representation of the audio signal at the common connection point 213. An emitter-follower amplifier is provided by the combination of circuit elements including diode 214, resistors 215 and 217, and NPN transistor 219.

The threshold detector 163 includes comparators 221 through 224, and a plurality of exclusive OR gates 231 through 238 (also known as XOR gates). The non-inverting input terminals of comparators 221 through 224 are connected in common to the emitter electrode of emitter follower transistor 219. A resistive voltage divider network includes resistors 241 through 245 connected in series between voltage terminal 197 and ground. The common connections between the pairs of resistors 241 and 242, 242 and 243, 243 and 244, 244 and 245, are connected to the inverting input terminals of the comparators 221 through 224, respectively. The output terminals of comparators 221 through 224 are individually connected to the common connection between two input terminals of exclusive OR gates 231 and 232, 233 and 234, 235 and 236, and 237 and 238, respectively, as shown. Another input terminal of each one of exclusive OR gates 231, 233, 235, and 237, respectively, are connected in common to the X clock terminal 251 of oscillator 171. Another input terminal of exclusive OR gates 232, 234, 236, and 238, are connected in common to the Y clock signal terminal 253 of oscillator 171.

The oscillator 171 includes a terminal 255 for receiving a ground signal to shut down the oscillator in the event of some system failure. A pull-up resistor 257 is connected between voltage terminal 259 for receiving a DC voltage +V2, and the common connection of the shutdown terminal 255 and NAND gate Schmidt trigger 261. The other input terminal of NAND gate Schmidt trigger 261 is connected to grounded capacitor 263, and to the parallel connected feedback network between the other input terminal and its output terminal including in one leg a resistor 265, and in another leg the series circuit of a resistor 267 and diode 269, with the collector of the diode 269 being connected to the common connection of the other input terminal and capacitor 263. The output terminal of NAND gate Schmidt trigger 261 is connected to the input terminal of a second NAND gate Schmidt trigger 264, the latter having another input terminal connected to the voltage terminal 259, and an output terminal (provides clock pulses 286 of FIG. 9) connected in common to a D-type flip flop 266, and an individual input terminal of each one of NAND gate Schmidt triggers 267 and 269. The NAND gate Schmidt triggers 267 and 269 each have output terminals individually connected to the X and Y clock terminals 251 and 253, respectively. Note that the feedback resistor 265 and capacitor 263 control the frequency of the oscillator of clock generator 171. In this example the frequency of clock signal 286 at the output of NAND 261 is predetermined to be about 400 kHz, for producing 200 kHz X and Y clock signals. Other applications may require a higher or lower frequency clock signal 286.

The coil driver circuit phase lock driver 169 includes a plurality of intermediate power complementary MOSFET switching amplifiers 275 through 284, respectively, each of which are identical. Each one of the switching amplifiers 275 through 284 include a resistor 285 and diode 287 connected in parallel between an input terminal for the switching amplifier and the gate electrode of a P-type MOSFET transistor 289, and another parallel circuit of a resistor 291 and diode 293 connected between the input terminal and the gate electrode of an N-type MOSFET transistor 295, with an output terminal being provided at the common connection between the main current paths of the MOSFET transistors 289 and 295. Note, for MOSFET transistors 289 and 295, their respective drains are connected together, that is in common, and their sources to +V2 and signal common, respectively. Five toroidal coupling transformers 297 through 301 are included in the coil driver phase lock driver 169, each with a primary winding 302 through 306, respectively, connected between the output terminals of the pairs of MOSFET switching amplifiers 275 and 276, 277 and 278, 279 and 280, 281 and 282, and 283 and 284, respectively. Coupling transformer 297 also includes four secondary windings 310 through 313. The toroidal transformers 298 through 301 each have a pair of secondary windings 314 and 315, 316 and 317, 318 and 319, and 320 and 321, respectively. A plurality of N-type high-power MOSFET switching transistors 330 through 341 have their main current paths connected in series, respectively, between a voltage terminal 343 for receiving +E volts and a voltage terminal 345 for receiving −E volts. Note, for MOSFET pairs transistors 330 and 331, the drain of the first of the pair 330 is connected to terminal 343, and the source of which is connected to the drain of the second of the pair (331), the latter having its source connected to terminal 345. The other of the pairs of MOSFET transistors 332 through 341 are similarly connected, respectively. A plurality of input resistors 347 are connected individually between the gate electrodes of switching transistors 330 through 341, respectively, and one end of the secondary windings 310 through 321, respectively. A plurality of diodes 349 are individually connected in parallel across each one of the input resistors 347, respectively, for "speeding up" the turn off of MOSFET switching transistors 330 through 341, respectively. The other ends of the secondary windings 310, 312, 314, 316, 318, and 320, are individually connected to the common connections between the pairs of power MOSFET switching transistors 330 and 331, 332 and 333, 334 and 335, 336 and 337, 338 and 339, and 340 and 341, respectively. The other ends of the secondary windings 311, 313, 315, 317, 319, 321 are each connected to a voltage terminal 345 for receiving −E volts.

The coil driver network 169 drives the primary windings P1–P5 of toroidal transformer set 170. As shown, the toroidal transformer set 170 includes five toroid transformers T1 through T5. More specifically, the common connection between the main current paths of power MOSFET switching transistors 330 and 331 is connected in common to one end of each one of the primary windings P1–P5 of transformer set 170. The common connections between the main current paths of the power MOSFET switching transistors 332 and 333, 334 and 335, 336 and 337, 339 and 340, and 341 and 342, are connected to the other ends of the primary windings P1–P5, respectively. As shown, toroidal transformer 170, in this example, has been divided into two separate toroidal transformers 170' and 170". The toroidal transformer 170' includes the primary winding P1 and secondary winding S1, whereas the second toroidal transformer 170" includes the primary windings P2–P5, and the secondary winding S2, which in this example has been split into two independent secondary windings 348 and 350. By dividing the toroid transformer 170 into two separate toroidal transformers 170' and 170'', manufacturing costs for the toroidal transformer 170 are likely to be reduced relative to the configuration shown in FIG. 3. Note that the configuration of FIG. 3 is modifiable for providing the toroidal transformer 170 by winding the secondary winding S1 about the toroid 107 and connecting appropriate tapoffs to that winding; and further by winding two separate and independent secondary windings about the toroids 107–111, in a manner similar to the secondary winding 119 shown in FIG. 3, respectively. The rectifier 172 of FIG. 5, is provided in FIG. 6 via two high-speed bridge rectifier and filter circuits 172' and 172''. The rectifier 172' includes two common high-speed bridge rectifiers for rectifying the AC voltage produced in secondary winding S1 to provide three DC operating voltages of fixed level $+V_1$ at terminal 197, $+V_3$ at terminal 351, $-V_3$ at terminal 353, and a common or source of reference potential at ground terminal 355. The DC voltages $+V_3$ and $-V_3$ are of fixed level, and in this example provided for supplying power to a preamplifier (not shown) of power amplifier 173 of FIG. 5. The high-speed bridge rectifier and filter circuit 172'' provides the DC voltages $+V_4$, $-V_4$, and a source of reference potential, ground in this example, at terminals 357, 359, and 361, respectively, by rectifying the AC voltages produced by secondary winding 348 in combination with a portion of secondary winding S1, and secondary winding 350 in combination with a portion of secondary winding S1. The $+V_4$ and $-V_4$ voltages are stepwise amplitude modulated by the audio signal, in this example, applied to terminal 177, and are used to power the output stage (not shown) of audio amplifier 173. The high power DC voltage $+E$ and $-E$ applied to terminals 343 and 345, are derived from a separate power supply (not shown), as is the DC voltage $+V_2$. Note that in this example, the connection between secondary windings 170' and 170'' is required in order to obtain the necessary level of voltage for the voltages $+V_4$ and $-V_4$.

Operation of the embodiment of the invention of FIG. 6 (also see FIGS. 7–12) is as follows:

1. In this example, an input or command signal such as sinusoid 176 of FIG. 7 is rectified by rectifier 167 to produce a full-wave rectified signal 178 (see FIG. 8).

2. Whenever one of the comparators 221–224, respectively, senses that the amplitude of the fullwave rectified input signal 178 at that comparator's non-inverting terminal exceeds the level of the reference voltage at its inverting terminal, the output of the comparator responds by changing its output from
   a digital "0" to a digital "1" (positive voltage).

3. Whenever the output of a comparator 221–224 is low or at digital "0" its associated exclusive OR gate of 231–238 passes the associated X or Y clock signals.

4. Whenever the output of a comparator 221–224 is high or at a digital "1", its associated Exclusive OR gates 231–238 invert their associated X or Y clock signals.

5. When an exclusive OR gate's (any of 231–238) output level is high "1", its associated CMOS switch (one of 275–284) responds by turning on its respective N-main current path switching transistor 295, and whenever the output level is low "0", the associated CMOS switch (one of 275–284) responds by turning on its respective P-main current path switching transistor 289.

6. For a given one of the primary windings 303–306 of the coupling transformers 298 through 301, respectively, because the X clock pulses 288 and Y clock pulses 290 (see FIG. 10) are 180° out of phase or of opposite polarity with one another, at any given switching time for each one of the CMOS transistor switch pairs 275 and 276, 277 and 278, 279 and 280, 281 and 282, and 283 and 284, one will have its PMOS switch 289 conductive and its NMOS switch 295 non-conductive, and the other will be in an opposite switching state. The relative switching states of the aforesaid pairs of CMOS transistor switches will be reversed during the next half-cycle of the X and Y 200 kHz clock signals 288, 290 of this example.

7. In this example, CMOS switches 275 and 276, associated with the primary winding 302 of coupling transformer 297, have their input terminals directly connected to output terminals 251 and 253, respectively, of oscillator 171, for receiving the X and Y clock signals 288, 290, respectively. In this manner, the CMOS switches 275 and 276 are operated in alternate half-cycles of X and Y clock signals 288, 290 for passing current in one direction through the primary winding 302 of coupling transformer 297 during one half-cycle, and the opposite direction during the next half-cycle, continuously over successive and repetitive half-cycles of the X and Y clock signals. A pulsed AC waveform 292 of $\pm V_2$ volts, as shown in FIG. 12, is developed across primary winding 302. The alternating current flow through primary winding 302 will cause voltages to be induced into associated secondary windings 310 through 313, for in one-half cycle when X is "0" and Y is "1", turning on power MOSFETS 330 and 333, with transistors 331 and 332 cutoff, for passing a current pulse from terminal 343 through primary windings P1 to terminal 345. In the next half-cycle (X="1", Y="0") transistors 330 and 333 are turned off, and 331 and 332 turned on for passing a current pulse in the opposite direction through primary winding P1. Such alternate current flow in P1 causes a pulse-like AC voltage to be induced in secondary winding 170' which is rectified by rectifiers 172' and 172'', as previously described for producing "idle" voltage levels for $\pm V_3$.

8. The bridged pairs of CMOS switches 277 and 278, 279 and 280, 281 and 282, and 283 and 284, each respond to input signals at their gate electrodes, in the same manner as described above for CMOS switch pairs 275 and 276, for causing oppositely directed current pulses to flow through primary windings 298–301, respectively, during alternating half-cycles of the X and Y clock signals 288, 290. The aforesaid "pairs of CMOS switches" operate synchronously with CMOS switch pair 275, 276, whenever their respective ones of comparators 221–24 have a low "0" output, and asynchronously with CMOS switch pair 275, 276, whenever their respective ones of comparators 221–224 have a high "1" output.

9. Whenever CMOS switch pairs 277 and 278, 279 and 280, 281 and 282, and 283 and 284, are operating synchronously with CMOS switch pair 275 and 276, the resulting voltages induced from the associated coupling transformer primary windings 303–306 into secondary winding pairs 314 and 315, 316 and 317, 318 and 319, and 320 and 321, respectively, will cause the power MOSFET switch pairs 334 and 335, 336 and 337, 338 and 339, and 340 and 341, to each operate synchronously with power MOSFET switch pair 330 and 331. Accordingly, whenever NMOS transistor 330 is turned on, NMOS transistors 334, 336, 338, and 340 will also be turned on, whereas NMOS transistors 331, 333, 335, 337, 339, and 341 will be turned off (cutoff), thereby causing +E volts to be applied at each end of the primary windings P1-P5 of toroid transformer 170. Assuming such synchonons operation is maintained during the next half cycle of the X and Y clock signals 288, 290, respectively, the aforesaid NMOS transistors 330-341 will switch conduction states, causing −E volts to be applied at each end of primary windings P1 through P5. As a result, no voltage difference is developed across primary windings P2-P5 (the windings are each shorted to +E in one-half cycle and −E in another half-cycle of clock signals 288, 290), preventing any voltage or induction to secondary windings 347 and 349.

10. Whenever any one or combination of CMOS switch pairs 277 and 278, 279 and 280, 281 and 282, and 283 and 284, are operating asynchronously with CMOS switch pair 275 and 276, the resulting voltages induced from the associated ones of primary windings 303-306, respectively, into the associated ones of secondary winding pairs 314 and 315, 316 and 317, 318 and 319, and 320 and 321, respectively, will cause the associated NMOS transistor pairs 334 and 335, 336 and 337, 338 and 229, and 340 and 341 to operate asynchronously with NMOS switch pair 330 and 331, respectively. In turn, the associated ones of the primary windings P2 through P5 will have +E and −E applied across them, causing each of the energized ones of P2 through P5 to induce a voltage into secondary windings 348 and 350, the level of induced voltage being dependent upon the turns ratio between the energized one(s) of P2-P5 and secondary windings 348 and 350.

11. With reference to FIG. 13, a composite waveform is shown for purposes of illustration. Assume that at a given time the audio waveform applied to input terminal 177 is a sinusoid 371. The amplitude modulated power supply of FIG. 6 typically produces a stepwise approximated waveform 373 of the command or demand input signal applied to input terminal 177 (a sinusoid approximation in this example). The stepwise approximated waveform 373 is developed across secondary windings 348 and 350 and consists of a plurality of successive pulses of equal pulse widths but either the same or different amplitudes. The pulse train 373 has a frequency of 200 KHz, and in this example, each pulse thereof is a composite of voltages developed in secondary windings S1 and S2, as previously described. The amplitude modulated pulse train is rectified via rectifier 172″, for example, to produce amplitude modulated dc voltages +V4 and −V4 (these voltages have some predetermined minimum level), for example. Note that the pulsed waveform (not shown) produced across secondary winding S1 has pulses of equal amplitude having a frequency of 200 KHz. Rectifier 172′ rectifies the pulse train produced across S1 for providing the idle voltages +V1 and ±V3, as shown in FIG. 6. Note that +V1 is provided via a voltage regulator (not shown) included in rectifier 172′.

In summary, the amplitude modulated power supply of the embodiment of FIG. 6 responds to an audio signal applied to input terminal 177 of the full-wave rectifier 167, by first full-wave rectifying the signal. As previously mentioned, the same signal but of lower amplitude is applied to the power amplifier 173 (see FIG. 5), in this example. The fully rectified audio signal is then compared via comparators 221-224 against four predetermined voltage levels or references. XOR gates 231-238 serve as polarity switches. Dependent upon the state of each XOR gate 231-238, the output polarity of bridge switch pairs 277-278, 279-280, 281-282, and 283-284, may be switching synchronously or asynchronously relative to the main or idle voltage bridge switch pair 275-276. The threshold comparators 221-224 directly control the switching polarity of their associated switch pairs 277-278, 279-280, 281-282, and 283-284, via XOR gate pairs 231-232, 233-234, 235-236, and 237-238, respectively. More specifically, whenever any one of comparators 221-224 have a low or "0" output level, their respective pairs of XOR gates 231-232, 233-234, 235-236, and 237-238, pass associated "X" and "Y" clock signals unchanged. However, when a given comparator's output level is high or "1", the associated XOR gate pair now responds as an inverter, passing through "X" and "Y" clock signals. Note that "X" is equal to "$\overline{Y}$", and "Y" is equal to "$\overline{X}$" causing the switching reversal or change in polarity of the paired ones of switches 277-284, whenever the polarity of their associated "X" and "Y" clock signals change. The coil driver circuit phase lock driver 169 does not change the information content of signals from XOR gates 231-238, and gates 267 and 269, but serves as a buffer to boost the power of the signals necessary for energizing the primary windings P1-P5. The output transformer 170 consists of two sections; one section 170′ is constantly energized ("P1" and "S1"), and another, section 170″ ("P2", "P3", "P4" and "P5" in toroidal configuration with "S2") selectively energized. The first primary winding ("P1") serves as an idle winding, and is always active. Switch pairs 330, 331 and 332, 333 drive each end of "P1" respectively, in a full-bridge configuration. The other primary windings "P2-P5" each have one end connected in common with one end of "P1", and each have another end driven by their respective switching circuit pair of switches 334-341, either synchronously with 330, 331 and 332, 333, or asynchronons thereto. "P2"-"P5" are shorted when switched synchronously with "P1" Alternatively, when any one or more of "P2"-"P5" are switched asynchronously with "P1", each has +E and −E volts toggled across the winding at the oscillator or clock rate of 200 kHz, in this example. "S1" and "S2" are wired in series such that any voltage present in "S2" is boosted by the ever-present idle voltage in "S1". The extra windings in "S1" are used to power certain of the logic and drive circuitry previously discussed, with the exception of the oscillator 171 and drive circuitry phase lock driver 169, which are powered by an external supply for guaranteed startup.

The circuit of FIG. 6 functions to convert a musical signal into a threshold-triggered amplitude modulated signal having a waveform that is a crude representation of rectified music modulating a 200 kHz carrier signal, in this example. The power amplifier 173 is energized by the rectified AM signal in place of its usual dc voltage rails. As a result, the power amplifier 173 never receives more than a specified threshold of voltage at the instant it is drawing power, greatly reducing its power dissipation. Also, note that the threshold method and apparatus of this embodiment of the invention is limited only by the speed of the voltage comparators 221-224, whereas present inexpensive methods of A-to-D conversion employing time consuming iteration (such as could be employed in the embodiment of FIG. 4) are not fast enough (must be less than one microsecond) to respond to 20.0 kHz audio signals sampled at a 200 kHz rate, in the preferred embodiment of the invention for use in audio systems.

Figure 14:
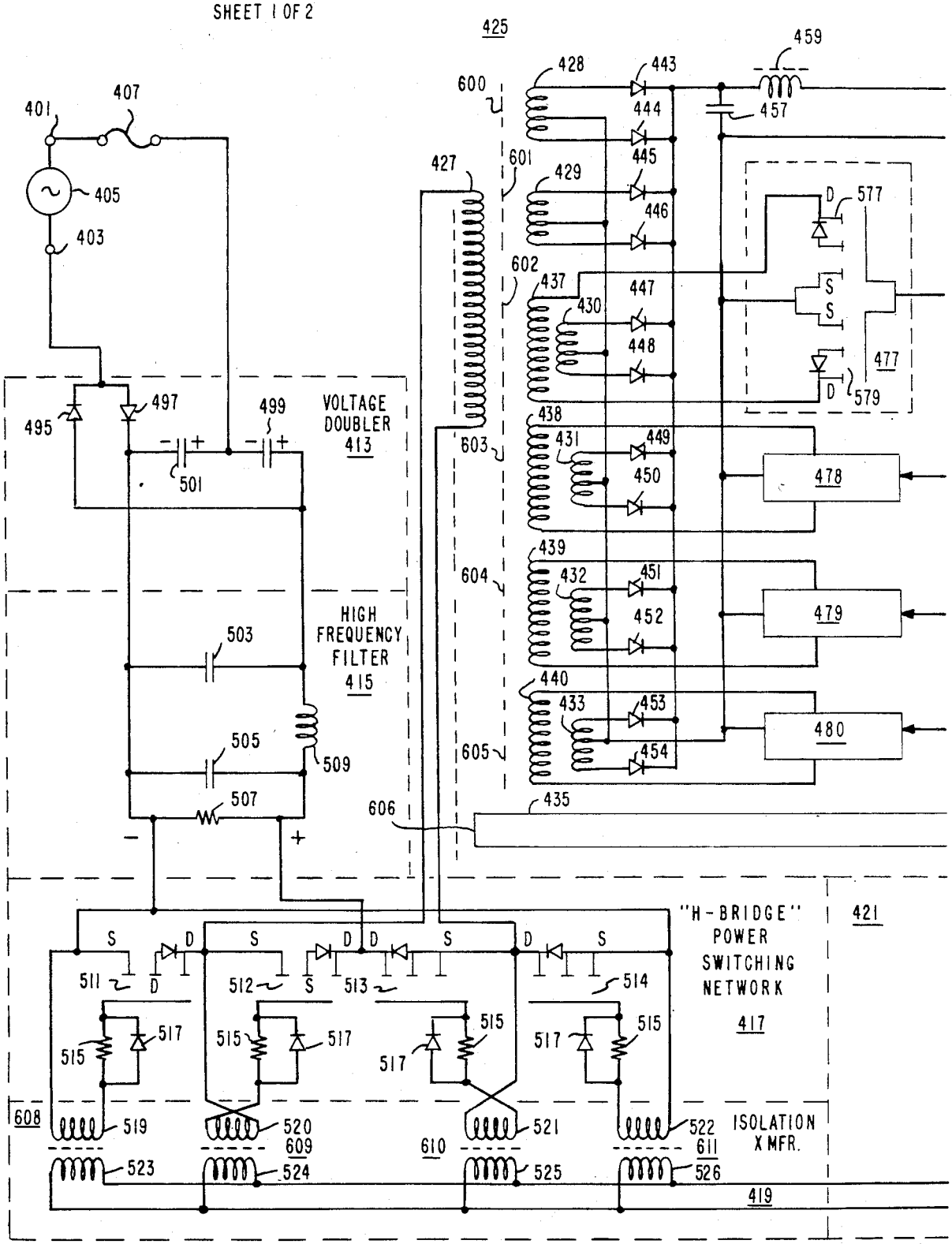
FIG. 14 shows a detailed circuit/logic schematic diagram of yet another embodiment of the invention.
Figure 14:
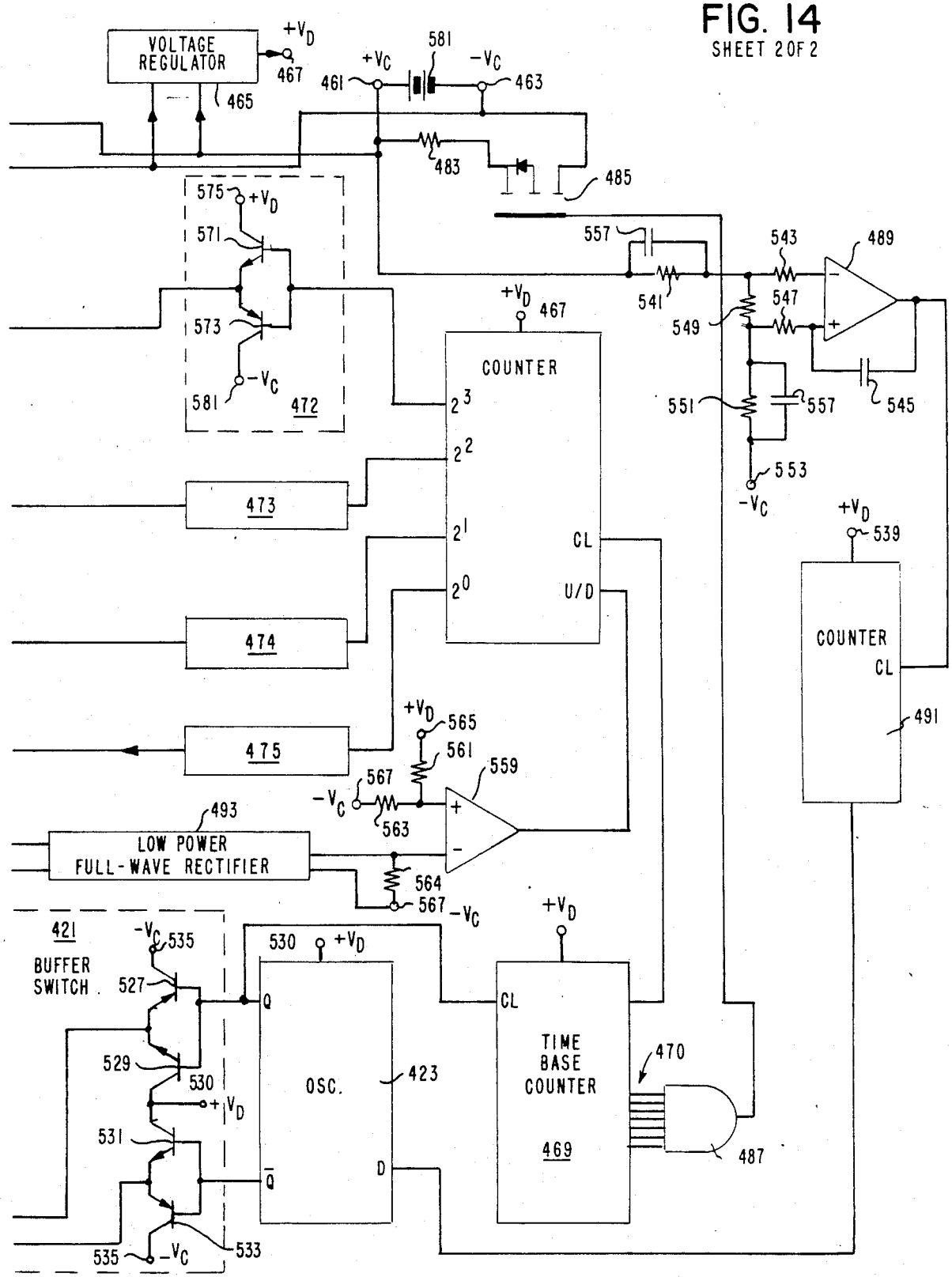

Another embodiment of the invention is shown in FIG. 14 for providing a battery charging system. The system includes a pair of terminals 401 and 403 for receiving an AC voltage 405, in this example the line voltage. Terminal 401 is connected through a fuse 407 to a voltage doubler circuit 413. The AC voltage input terminal 403 is directly connected to the voltage doubler circuit 413. The output of the voltage doubler circuit 413 is connected through a high-frequency filter 415 to a "H-Bridge" power switching network 417. The power switching network 417 is coupled through an isolation transformer 419 to a buffer driver 421. The complementary buffer driver 421 is in turn driven by a transformer assembly 423.

A transformer assembly 425 includes a primary winding 427 connected to the output of the "H-Bridge" power-switching network 417, a plurality of secondary windings 428 through 433, a secondary current-sensing winding 435 which senses primary current, and a plurality of tertiary windings 430 through 433. In practice, for frequencies above 20.0 kHz, transformer assembly 425 is made of ferrite core material, and may include seven toroid cores 600–605 about which are wound windings 428 through 433, respectively; core 606 is wound with a 200 turn winding 435. The primary winding 427 is wound through (shared by) all of the toroid transformer cores 600–605; core 606 is allotted one turn of the primary winding. Also, other types of cores such as pot cores or E-cores, for example, can provide cores 600–606. For frequencies below 20 kHz, tape wound cores can provide transformers 600–606, for example. Also, for frequencies below 2 kHz, laminated core construction can be used for transformers 600–606, for example. The secondary windings 428 through 433 are connected through rectifying diodes 443 through 454 to the common connection of a filter capacitor 457 and filter choke 459. The other end of the choke 459 is connected to output terminal 461 for providing a positive charging current via $+V_C$. The other end of capacitor 457 is connected to an output terminal 463 for returning the charging current to $-V_C$. A voltage regulator circuit 465 is connected between terminals 461 and 463, for providing the digital logic voltage $+V_D$ at output terminal 467 of regulator 465.

A time base counter 469 is driven at its clock (CL) terminal by a pulse train from oscillator 423. In turn, the time base counter 469 develops a lower frequency clock signal for connection to the clock terminal (CL) of a counter 471. The counter 471 provides 4-bit binary switching signals $2^3$, $2^2$, $2^1$, $2^0$ (most to least significant bits), for complementary bipolar buffers 472 through 475, respectively. In turn, the bipolar buffers 472 through 475 drive N-channel enhancement MOSFET switch pairs 477 through 480, respectively, in this example. The latter MOSFET switch pairs 477–480 are operable for selectively shorting or open-circuiting the tertiary windings 437 through 440, respectively, for changing the effective turns ratio for the transformer set 425, as will be described in detail below. In this example, the transformer set 425 is an assembly of toroids.

An example of an end of charge detection circuit includes a resistor 483 having a value of 8 ohms, an N-channel MOSFET switch 485 operable for connecting the resistor 483 between the output terminals 461 and 463, an AND gate 487 driven by the time base counter 469, a voltage comparator 489, and a counter 491.

The battery charging circuit of FIG. 14 will now be described in greater detail. The fuse 407 protects the circuit from over-current conditions.

The voltage doubler 413 includes a diode 495 having its cathode electrode connected in common to an anode electrode of another diode 497 and input voltage terminal 403. The anode electrode of diode 495 is connected to the + end of an electrolytic capacitor 499, in this example. The − end of the capacitor 499 is connected in common to the + end of electrolytic capacitor 501 and to input terminal 401 via fuse 407. The − end of the capacitor 501 is connected to the cathode electrode of diode 497. The output voltage from the voltage doubler 413 is taken from across the series circuit of the capacitors 499 and 501 and applied across a filter capacitor 503 component of high-frequency filter 415. One end of capacitor 503 is connected in common to one end of another filter capacitor 505, and one end of a bleeder resistor 507. The other end of capacitor 503 is connected through an inductor 509 to the other ends of capacitor 505 and resistor 507. The output from the high-frequency filter 415 is taken from across resistor 507.

The "H-Bridge" switching network 417 includes four power N-channel enhancement MOSFET transistors 511 through 514, for example, connected in series pairs, and their gate electrodes each coupled through the parallel combination of a resistor 515 in parallel with a diode 517 to one end of individual secondary windings 519 through 522, respectively, of isolation transformer 419. Note that in this example, the isolation transformer assembly includes four ferrite core transformers 608 through 611, upon which are wound primary and secondary windings 523 and 519, 524 and 520, 525 and 521, and 526 and 522, respectively. The cathode electrodes of the diodes 517 are connected to the gate electrodes of the NMOS switching transistors 511 through 514, respectively. The primary windings 523 through 526 of isolation transformer assembly 419 each have one end connected in common to the commonly connected emitter electrodes of PNP transistor 527 and NPN transistor 529 of buffer 421. The other ends of the primary windings 523 through 526 are connected in common to the commonly connected emitter electrodes of NPN transistor 531 and PNP transistor 533 of the buffer 421. The commonly connected base electrodes of the NPN and PNP transistors 527, 429, respectively, are connected to the Q output terminal of oscillator 423. The commonly connected base electrodes of NPN and PNP transistor 531, 533, respectively, are connected to the $\overline{Q}$2. The collector electrodes of PNP transistors 527 and 533 are each connected via a power terminal 535 to the $-V_C$ voltage or common at output terminal 463. The collector electrodes of NPN transistors 529 and 531 and the oscillator 423 are connected via terminal 530 to $+V_D$ voltage terminal 467 of the voltage regulator 465. Also, oscillator 423 has a disable terminal D connected to the output of a counter 491.

The end of charge detection circuit embodiment of the invention includes the time base counter 469, AND gate 487, counter 491, comparator 489, N-channel MOSFET switching transistor 485, and shunt resistor 483. In this example, the time base counter 469 receives clock signals at its CL clock terminal from the Q output terminal of oscillator 423. One output line from the time-base counter 469 is connected to the clock (CL)

input terminal of counter 471, and seven other output or timing lines 470 thereof are connected to the seven input AND gate 487. The output of AND gate 487 is connected to the gate electrode of NMOS switching transistor 485. The clock (CL) input terminal of counters 491 and 469 are connected to the output of comparator 489. The logic voltage $+V_D$ is connected to counters 491 and 469 via terminals 539 and 540, respectively. The voltage $+V_C$ developed at output terminal 461 is connected via the voltage divider resistors 541, 549, and 551 to terminal 553 which is common to terminal 463 and the negative electrode of the battery 581 being charged. The inverting input terminal of comparator 489 connects via resistor 543 to the common connection of capacitor 557 and resistors 541 and 549. The non-inverting input terminal of comparator 489 is connected via capacitor 545 to its output terminal, and to one end of an input resistor 547. The other end of input resistor 547 is connected in common to an end of each one of series-connected voltage divider resistors 549 and 551, and a capacitor 557. The other end of resistor 551 is connected to a terminal 553 for receiving $-V_C$ volts. Bypass capacitors 555 and 557 are connected in parallel with resistors 541 and 551, respectively. Also, the main current path or channel of MOSFET resistor 485 is connected in series with resistor 483 between the output terminals 461 and 463.

The full-wave rectified positive output voltage from rectifier 493 is connected across resistor 564 to the inverting input terminal of comparator 559, the latter also having its output terminal connected to the up/down (U/D) terminal of counter 471, and its non-inverting input terminal connected to the common connection of series-connected voltage divider resistors 561 and 563 which provide a reference for comparing the voltage across resistor 564. The other ends of resistors 561 and 563 are connected to terminal 565 for receiving logic voltage $+V_D$, and terminal 567 for connection to common $-V_C$, respectively. Current sense load resistor 564 is terminated to common voltage $-V_C$.

The counter 471 receives the logic voltage $+V_D$ via terminal 467. The complementary bipolar switching circuits 472 through 475 each include an NPN transistor 571, and PNP transistor 573, connected as shown for buffer circuit 472. The base electrodes of transistors 571 and 573 are connected in common to an output line "$2^3$" (most significant bit) from counter 471. Transistor 571 has a collector electrode connected via terminal 575 to $+V_D$ volts, and has its emitter electrode commonly connected to the emitter electrode of transistor 573 and commonly connected gate electrodes of N-channel MOSFET transistors 577 and 579 of switching circuit 477. The collector electrode of transistor 573 is connected via terminal 581 to $-V_C$ volts. Similar to buffer circuit 472, the buffer circuits 473 through 475 each receive an output line $2^2$, $2^1$, $2^0$, respectively, from counter 471, and each provides an output line to the MOSFET buffers 478 through 480, respectively.

The N-channel MOSFET buffers 477 through 480 are identical, with each being configured as shown for switching circuit 477. More specifically, switching circuit 477 includes MOSFET buffer transistors 577 and 579 having commonly-connected gate electrodes, and series opposing connected main current paths, with their source electrodes being connected in common to output voltage terminal 463 as a reference for the gate voltage developed by buffer 472. Note, terminal 463 receives $-V_C$ volts. The series opposing connected main current paths of MOSFET transistors 577 and 579 of switching circuit 477 are led through tertiary winding 437. Similarly, the main current paths of MOSFET switching circuits 478 through 480 are led through tertiary windings 438 through 440, respectively, of transformer assembly 425.

The operation of the battery-charging circuit of FIG. 14 will now be described in detail. Initially, without a battery 581 connected between the output terminals 461 and 463, as shown for charging, the logic voltage $+V_D$ derived from the battery or bank of batteries 581 to be charged is not available. Accordingly, the circuit will be inoperable, even if the AC line voltage 405 is applied between terminals 401 and 403, because oscillator 423 cannot begin oscillating until the battery 581 is connected between terminals 461 and 463. To initiate operation of the circuit, a battery or bank of batteries 581 is connected as shown for charging across terminals 461 and 463, and in this example an AC line voltage 405 is connected between input voltage terminals 401 and 403. Voltage regulator 465 processes the voltage from the battery or bank of batteries 581 to provide the $+V_D$ logic voltage. Also, the battery or batteries 581 provide the initial $+V_C$ and $-V_C$ voltages for other portions of the circuit as shown.

The line voltage 405 (typically 110 volts AC) is rectified by the voltage doubler 413, and passed through the high-frequency filter 415 for connection to the "H-Bridge" power switching network 417. Note that unless a discharge battery or bank of batteries 581 is defective, sufficient voltage will remain in the battery 581 for providing the previously-mentioned operating voltages for the circuit.

The oscillator 423 begins oscillating, and drives the buffer transistor pairs 527, 529 and 531, 535 into alternate conduction states, respectively, at a predetermined switching rate. Assume, for example, that the oscillator 423 is switching the buffer 421 at a 140 kHz rate. In one switch state of buffer 421, transistor 529 is conductive to supply current from terminal 530 to the parallel connected primary windings 523 through 526 of isolation transformer assembly 419, and transistor 533 is conductive to return current to terminal 535. Also at this time, transistors 527 and 531 are turned off. Note that this first switching state of buffer switch 421 occurs when the Q and $\overline{Q}$ outputs of oscillator 423 are "high" and "low", respectively. During the next half-cycle of the oscillator 423, the Q and $\overline{Q}$ outputs will go "low" and "high", respectively, reversing the conduction states of the buffer 421 transistors. In the second conduction state, the transistors 527 and 531 will be turned on, whereas transistors 529 and 533 will be turned off, causing current to flow in the opposite direction through the primary windings 523 through 526. Depending upon the relative polarization between the primary windings 523 through 526, and their associated secondary windings 519 through 522, respectively, during one conduction state of buffer 421, MOSFET transistors 511 and 513 will be turned on for driving a pulse of current through primary winding 427 of transformer assembly 425 in one direction, while MOSFET transistors 512 and 514 are turned off. During the opposite conduction state of buffer switch 421, or alternate half-cycle of the oscillator 423, MOSFET switches 511 and 513 will be turned off, and MOSFET switches 512 and 514 will be turned on for driving a pulse of current in the opposite direction through the primary winding 427 of transformer assembly 425. Note that the buffer 421 provides the necessary power for operating the heavily capacitive gates of the MOSFET switching transistors 511 through 514, since the oscillator 423 (provided by type 2526 integrated circuit, in this example) is incapable of directly driving the gates of the MOSFET switches 511 through 514. Also, the isolation transformer 419 provides DC electrical isolation between the switching network 417 and buffer 421. The alternately directed pulses of current through the primary winding 427 cause voltages to be induced across the secondary windings 428 and 429, and across the tertiary windings 437 through 440. The 140 kHz pulsed AC voltage induced into secondary windings 428 and 429 is full-wave rectified via diodes 443 and 444, and 445 and 446, respectively; filtered by capacitor 457 and choke 459; and applied across output terminals 461 and 463. Assume that primary winding 427 has 14 turns, that secondary windings 428 through 433 have ten turns, ten turns, ten turns, twenty turns, forty turns, and eighty turns, respectively, and with each being centertapped. Further assume that sensing winding 435 has 200 turns, and tertiary windings 437 through 440 have ten turns, twenty turns, forty turns, and eighty turns, respectively. Further assume that the maximum voltage available to the primary winding 427 is 380 volts with high-line voltage, while drawing very little current through the transformer assembly 425. In the present assembly example, the circuit parameters are adjusted for producing a desired magnitude of charging current to battery or battery bank 581, until the latter is detected to have a full charge.

Initially, when a discharged battery or bank of batteries 581 is connected across terminals 461 and 463, and the line voltage 405 is applied across terminals 401 and 403, operation of the charging system of FIG. 14 begins with oscillation of oscillator 423, and charging current may begin to flow into the battery 581. If the primary load current sensed by the current-sensing secondary winding 435 is below the desired magnitude, the comparator 559 provides an output level that is "high" or at a digital "1" for causing the counter 471 to count up. As the counter 471 counts up to increasingly higher counts, the four-bit digital output from the counter 471 as applied to the input terminals of the buffer circuits 472 through 475, respectively, for operating the MOSFET switching circuits 477 through 480, respectively, for shorting appropriate ones of the tertiary windings 437 through 440, to increase the effective volts per turn of the primary winding 427 which induces increased volts per turn across all tertiary and secondary windings of assembly 425 which are not effectively shorted. In other words, as additional tertiary windings 437–440 are shorted, the effective turns ratio of transformer assembly 425 decreases, causing the magnitude of charging current to increase relative to windings 428–433. Assuming that from a digital standpoint, tertiary winding 440 is shorted whenever the most significant bit ($2^3$) of the four-bit digital signal from counter 471 is present ("high"), tertiary 438 is shorted by the next least significant bit ($2^2$) going "high", 432 by the third order significant bit ($2^1$) going "high", and tertiary winding 440 by the least significant bit ("$2^0$") going "high" from counter 471. Battery 581 forms a low impedance load across which a small increase in voltage causes a relatively large increase in current. Once the voltage induced across any secondary winding 428–433, exceeds the battery voltage plus the forward voltage drop of the associated rectifying diode, the shorting of the associated tertiary winding results in a large increase of charging current flowing into the battery 581. Thusly, with the number of secondary turns allowed for each transformer in the assembly 425 being proportioned, as described above, in a binary progression, a control resolution of one part in sixteen is achieved by use of only four determinants. Note that (1) when any one of binary switching circuits 472–475 receive a low or "0" output signal from counter 471, their respective NPN transistor 571 turns off, and PNP transistor 573 turns on for applying $-V_C$ to the gate of their associated one of MOSFET switching circuits 477–480, keeping the latter cutoff and the associated one of tertiary windings 437–440 unshorted; and (2) when any one of binary switching circuits 472–475 receive a high or "1" output signal from counter 471, their respective NPN transistor 571 turns on (PNP transistor 573 turns off) for applying $+V_D$ to the gate of associated one of MOSFET switching circuits 477–480, causing the associated MOSFET transistors 577 and 579 to turn on for shorting the associated one of tertiary windings 437–440.

When counter 471 reaches too high a count, or some other condition emerges, that causes more than a predetermined magnitude of load current to be drawn by the primary 427, the increased voltage developed by the secondary winding 435 causes the output of comparator 559 to change state; that is to go "low" or be at a binary "0" Counter 471, in response to the "0" signal from comparator 559, begins counting down, operating the buffers 472 through 475, and in turn the switches 477 through 480, to release shorted ones of the tertiary windings 437 through 440 for effectively raising the turns ratio of transformer assembly 425, thereby reducing the charging current flow to the batteries 581. As the battery or bank of batteries 581 take on more charge, a greater level of voltage will be required across terminals 461 and 463 to continue to draw the predetermined level of primary current to induce complete charging of the battery 581. As the charging current decreases, the current flowing in the primary winding 427 will decrease to below a predetermined magnitude, whereby the current-sensing winding 435 will have a decreased voltage across it, causing comparator 559 to change state when the voltage at its inverting terminal drops below the level of the reference voltage at its non-inverting terminal, causing the output of comparator 559 to go high, for in turn causing counter 471 to again begin counting up. As counter 471 counts up, the switches 472 through 475 are operated for causing the MOSFET switching circuits 477 and 480 to progressively short more of the secondary windings 430 through 433 until a combination of shorted ones of those windings is reached that increases the magnitude of induced charging current to reflect as the desired primary current flow. In this closed-loop manner, appropriate ones of the tertiary windings 437 through 440 are either shorted or unshorted at any given time for maintaining the input load current at the desired level. Accordingly, regulation of the primary load current is provided by regulating the power delivered to battery 581.

Operation of the end of charge detection circuit for the battery charging system of FIG. 14 will now be described. Assume that a series bank of six 6 volt batteries 581 are connected between terminals 461 and 463 for recharging. Also, note that if a battery is partially discharged, any charging current delivered to the battery raises the voltage across the battery only slightly due to the very low impedance inherent to the battery. When a battery is fully charged, or very close to its fully-charged point, it attains what is known as its "gas point". At this gas point the electrolyte water begins to dissociate into its elements which are hydrogen and oxygen. Changes of the charging current into the battery will cause increasingly detectable changes in the voltage across the battery, due to the energy requirement for dissociating the water elements. For example, for the bank of six 6 volt batteries 581, when these batteries are near their gas point, a three ampere change in charging current can cause about a 1.25 volt change in voltage across the battery. The end of charge detecting circuit takes advantage of this fact by periodically placing a resistor 483 across terminals 461 and 463, and detecting the change in voltage across these terminals, for detecting when the gas point or end of charge of the battery 581 is attained. In this example, the time-base counter 469, driven by a 140 kHz clock signal from oscillator 423, provides both a 70 kHz clock signal to counter 471, and a seven-bit digital output signal for application to the input terminals of AND gate 487. Also in this example, the output of AND gate 487 goes "high" for about 1.8 seconds every two minutes, for turning on MOSFET transistor 485. When MOSFET transistor 485 turns on, its main current path reduces in impedance for substantially directly connecting resistor 483 across terminals 461 and 463 (across the battery 581 being charged). Resistor 483 "steals" or shunts charging current away from battery 581. Comparator 489 compares the voltage at output terminal 461 with the reference voltage at its non-inverting input terminal, for changing the level of its output voltage to a "high" level whenever the voltage across battery 581 decreases by more than one volt, in this example, when the shunting resistor 483 is connected thereacross, causing counter 491 to count up by one count. Assuming that the battery 581 is at its gas point, when a count of 15 is reached by counter 491, that is after about 30 additional minutes (15 times 2 minutes) of supplying charging current to the battery 501, counter 491 produces a "high" output signal for application to the disable (D) terminal of oscillator 423, causing the oscillator to turn off. When oscillator 423 is so turned off, the charging circuit is disabled, and no further charging current is delivered to the battery or bank of batteries 581. In this manner, after the "gas point" of the battery or bank of batteries 581 is reached upon charging, charging is continued to allow time for all of the cells of the various batteries in the bank of batteries 581 to reach a full charge. Note, from has been previously mentioned, that whenever the shunting resistor 483 is connected across output terminals 461 and 463 (across battery 581), when the battery 581 has not attained its "gas point" or is near its end of charge, less than a one volt drop in the voltage across the output terminals 461 and 463 will be detected, causing the output of comparator 489 to remain at a "low" or digital "zero" level, preventing any counting up by counter 491 during the time of shunting battery 581 with resistor 483.

An engineering prototype for the battery charger in FIG. 14 was constructed by the present inventor by using, for example, integrated logic chips type 4516 for counter 471, type 2526 for oscillator 423, the combination of three integrated circuit chip types including one 4520, and two 4040 counter chips for providing a 32 stage counter for a time base counter 469, an eight-stage counter for counter 491, a CA3140 for each one of the comparators 489 and 559, IRF640 N-channel MOSFETS for transistors 577 and 579, and IRF450 MOSFETS for transistors 511 through 514. The logic voltage $+V_D$ was set at 12 volts DC. The power transformer assembly 425 was provided with seven ferrite toroid transformers 600 through 606 having cores with magnetic areas of 5 $CM^2$, 5 $CM^2$, 5 $CM^2$, 2.5 $CM^2$, 1.25 $CM^2$, and 0.625 $CM^2$, respectively; a primary winding 427 having 14 turns passing through all the toroids of assembly 425; secondary windings 428–433 having 10, 10, 10, 20, 40, 80 turns, respectively, each being center-tapped; sense winding 435 having 200 turns; and tertiary windings 437–440 having 10, 20, 40, and 80 turns, respectively.

During tests of the prototype system, a series stack of six 6 volt traction batteries was connected between the output charging terminals 461 and 463. A predetermined magnitude of charging current of about 22 to 28 amperes for the prototype was maintained. This charging current was reflected as a primary load current of 12.5 amperes at nominal line voltage of 110 volts. At any given time, using the previously described closed loop configuration, the combination of shorted and unshorted ones of the tertiary windings 437 through 440 were maintained for providing the predetermined magnitude of primary load current. Periodically, about once every two minutes, shunting resistor 483 having a value of about 8 ohms was connected across the bank of batteries 581 for about 1.8 seconds. With charging current flowing into the battery 581, a voltage change of greater than one volt was taken as an indication that the "gas point" of the batteries 581 had been reached. As previously mentioned, this condition exists only when the batteries 581 are at or near full charge. The one volt differential was detected via the comparator 489, which clocked the eight-stage counter 491, which in the prototype was configured to count to 32 before applying a disable signal to oscillator 423. In other words, in the prototype, about one hour (32 times 1.8 minutes) after the "gas point" for the bank of batteries 581 was detected, oscillator 423 was disabled for terminating the flow of charging current to the batteries 581.

The present inventor determined that the battery charging system prototype of this invention required approximately six hours to fully charge the bank of six 6 volt traction batteries 581. Conventional charging systems can require about twelve hours to accomplish the same task. Traction or mode of batteries that are readily charged by the charging system of FIG. 14, are typically used in wheel chairs, go-carts, and battery-operated vehicles in general.

A prototype of the amplitude modulated power supply of FIG. 6 was constructed. Note that although the paired ones of switches 332 through 341 are operated substantially either synchronously or asynchronously with the pair of switches 330 and 331, in a practical circuit they are typically operated either in phase or out of phase to permit a "lead time" between switch transitions to avoid race conditions.

Although particular embodiments of the present invention have been shown and described herein, such illustrated embodiments in the invention are not meant to be limiting, and variations therefrom are to be deemed within the scope and spirit of the appended claims hereto. For example, the embodiments of FIGS. 1 and 14 can be combined for providing control of both the primary and secondary windings, for establishing the secondary voltage and current at any given time.

We claim:

1. A power supply for providing an output voltage amplitude modulated by a command signal, comprising:
   first rectifier means for rectifying said command signal;
   means for providing a plurality of reference voltages;
   a plurality of comparator means for comparing the level of said rectified command signal individually with said plurality of reference voltages, respectively, each one of said plurality of comparator means changing the level of its output signal from "low" to "high" in response to said rectified command signal exceeding the level of the associated one of said reference voltages, respectively;
   a plurality of output transformers each including a primary winding, and each sharing at least one common secondary winding, one end of each primary winding being connected in common;
   a source of +E and −E volts DC;
   first switching means for alternately and successively applying at a predetermined frequency +E and −E volts, respectively, to said one end of each one of said plurality of primary windings;
   a plurality of second switching means, each having an output terminal connected individually to the other ends of said plurality of primary windings, for alternately and successively applying at said predetermined frequency +E and −E volts, respectively, to said other ends of each one of said plurality windings, respectively;
   first control means responsive to the level of the output signals from said plurality of comparator means associated with individual ones of said plurality of second switching means, respectively, for (1) when a given one of said comparator means has a high output level operating the associated one of said plurality of second switching means for alternately and successively applying +E and −E volts across the associated said primary winding, in opposite polarity over each half-cycle of operation, for adding the voltage contribution from the associated primary winding to said secondary winding, and (2) when a given one of said comparator means has a low output level operating the associated one of said plurality of second switching means substantially asynchronously with said first switching means, for alternately and successively connecting the ends of an associated one of said primary windings to +E or −E volts over each half-cycle of operation, respectively, for removing that said primary windings voltage contribution from said secondary winding, thereby producing in said secondary winding a pulsed voltage waveform at said predetermined frequency, amplitude modulated by said command signal.

2. The power supply of claim 1, further including:
   another rectifier means for rectifying said pulsed voltage waveform in said secondary winding for producing a DC voltage stepwise modulated in level in accordance with ranges of amplitude of said command signal, respectively.

3. The power supply of claim 1, wherein said rectifier means is a full-wave rectifier.

4. The power supply of claim 1, further including:
   one of said plurality of transformers having its primary winding serving as an "idle winding";
   third switching means for alternately and successively applying +E and −E volts to other end of said "idle winding", said third switching means operating substantially asynchronously with said first switching means for alternately and successively applying at said predetermined frequency +E and −E volts across the one and another ends of said "idle winding"; and
   said one output transformer further including another secondary winding associated with said "idle winding"; and
   another rectifier means for rectifying a pulsed AC waveform induced in said another secondary winding from said "idle winding", for providing dc logic voltages for said power supply.

5. The power supply of claim 2, wherein said command signal is an audio signal, and the dc output voltage from said another rectifier means is applied to power an output stage of an audio amplifier amplifying said audio signal, for improving the power efficiency of said audio amplifier.

6. The power supply of claim 1, further including:
   first through third secondary windings in said output transformer, said third secondary winding having a centertap and first and second quarter taps;
   one of said plurality of primary windings serving as an "idle winding"; and
   third switching means for alternately and successively applying +E and −E volts to the other end of said "idle winding", said third switching means operating substantially asynchronously with said first switching means for alternately and successively applying at said predetermined frequency +E and −E volts across the one and another ends of said "idle winding", for inducing a pulsed AC waveform of fixed amplitude into said third secondary winding;
   one end of each one of said first and second secondary windings being connected to the first and second quarter taps of said third secondary winding in a polarity for boosting the voltage developed between the other ends of said first and second secondary windings.

7. The power supply of claim 6, wherein said command signal is an audio signal, said audio signal also being amplified by an audio amplifier including a preamplifier stage and an output stage, said power supply further including:
   second rectifier means for rectifying the AC voltage developed across the other ends of said first and second secondary windings, for energizing said output stage of said audio amplifier with a DC voltage amplitude modulated by said audio signal; and
   third rectifier means connected to the centertap and each end of said third secondary winding, for rectifying the AC voltage developed in said third secondary winding for providing fixed level DC voltages for both energizing a preamplifier stage in said audio amplifier, and for logic power requirements in said power supply.

8. The power supply of claim 1, wherein said means for providing a plurality of reference voltages, includes:
   a source of $+V_1$ volts;
   a source of reference potential;
   resistive voltage divider means connected between said sources of $+V_1$ volts and reference potential, respectively, for providing said plurality of reference voltages.

9. The power supply of claim 1, wherein said plurality of comparator means includes:
  a plurality of voltage comparators each having a non-inverting input terminal for receiving the rectified command signal from said first rectifier means, each having an inverting input terminal for receiving successively lower level ones of said reference voltages, respectively, and each having an output terminal connected to individual input terminals of said first control means, respectively.

10. The power supply of claim 1, wherein said first control means includes:
  oscillator means for generating X and Y clock signals, with X being $\overline{Y}$, and Y being $\overline{X}$;
  a plurality of pairs of first and second two input exclusive OR gates, each pair having an input terminal of said first and second ones connected in common to receive an individual output signal from said plurality of comparators, respectively, each one of said first exclusive OR gates of each pair having their other input terminals connected in common for receiving said X clock signals, each one of said second exclusive OR gates of each pair having their other input terminals connected in common for receiving said Y clock signals, whereby (1) whenever said first exclusive OR gates receive a "low" output signal from their respective comparator means, the former pass said X clock signals, (2) whenever they receive a "high" output signal from respective comparator means, the former invert said X clock signals, thereby outputting equivalent Y clock signals, and (3) whenever any of said comparator means change their output signals from a "low" to a "high" level their associated second exclusive OR gates revert from passing said Y clock signals unaltered to inverting the Y clock signals, thereby outputting equivalent X clock signals; and
  means for coupling the output signals from said plurality of exclusive OR gates to said plurality of second switching means, respectively, whereby whenever one of said pairs of exclusive OR gates is so operating in an inverting mode, the associated second switching means is driven to operate substantially asynchronously with said first switching means, and whenever one of said is so operating in a non-inverting mode, said second switching means is driven to operate synchronously with said first switching means.

11. The power supply of claim 1, wherein said predetermined switching frequency is greater than 20 kHz, and said transformer means includes:
  a plurality of stacked ferrite toroid cores, said plurality of primary windings being wound about individual ones of said plurality of toroid cores, respectively, said secondary winding(s) being wound about the entire stacked array of said plurality of stacked ferrite toroid cores.

12. A power supply for an audio amplifier, for supplying a voltage varying in accordance with an audio signal being amplified by said audio amplifier, comprising:
  first rectifier means for rectifying said audio signal;
  oscillator means for producing X and Y clock signals, the X clock signals being 180° out of phase with the Y clock signals;
  means for producing a plurality of DC reference voltages of successively lower predetermined DC levels;
  a DC source of $+E$ volts and $-E$ volts;
  a plurality of comparator means for comparing levels of reference voltages with the level of said rectified audio signals, respectively, each one of said comparator means changing its output signal from a "low" to a "high" level whenever the level of its associated reference voltage is exceeded by the level of said rectified audio signal;
  a plurality of transformers each including a primary winding, and each sharing at least one secondary winding, one end of each one of said primary windings being connected in common;
  a plurality of pairs of gating means, each pair being responsive to the output signal from an individual one of said plurality of comparator means, respectively, being either (1) "low" for passing the X and Y clock signals, or (2) "high" for inverting said X and Y clock signals, and outputting the gated clock signals on first and second signal lines, respectively;
  first complementary switching means directly responsive to said X and Y clock signals, for applying (1) $+E$ volts to said one ends of said plurality of primary windings, whenever X is "low" and "Y" is "high", and (2) $-E$ volts thereto whenever X is "high" and Y is "low";
  a plurality of second complementary switching means each individually responsive to the signals on said first and second signal lines from individual ones of said pairs of gating means, respectively, for applying individually to the other ends of said plurality of primary windings, respectively, (1) $+E$ volts whenever the associated ones of said first and second signal lines are "low" and "high", and (2) $-E$ volts whenever said first and second signal lines are "high" and "low", respectively, thereby in combination with said plurality of first complementary switching means, causing either (1) said plurality of primary windings to be shorted whenever an associated one of said plurality of comparator means has a "low" output signal, respectively, preventing any voltage contribution from that primary winding to said secondary winding, or (2) said plurality of primary windings to alternately and successively have opposite polarity voltage pulses connected thereacross over each half-cycle of said X and Y clock signals, whenever an associated one of said plurality of comparator means has a "high" output signal, respectively, whereby a pulsed AC signal amplitude modulated by said audio signal is induced in said secondary winding; and
  second rectifier means connected across said secondary winding, for rectifying the voltage developed in said secondary winding to provide said amplitude modulated DC voltage.

13. The power supply of claim 12, wherein said plurality of pairs of gating means each consist of an exclusive OR gate.

14. The power supply of claim 12, wherein said oscillator means has a frequency of 200 kHz, and said plurality of transformers are ferrite core transformers.

15. A power supply for an audio amplifier, for supplying a voltage varying in accordance with an audio signal being amplified by said audio amplifier, comprising:
  first rectifier means for rectifying said audio signal;

means for producing a plurality of DC reference voltages of successively lower predetermined DC levels;

a source of direct voltage;

a plurality of comparator means for comparing levels of reference voltages with the level of said rectified audio signals, respectively, each one of said comparator means changing its output signal from a "low" to a "high" level whenever the level of its associated reference voltage is exceeded by the level of said rectified audio signal;

a plurality of transformers each having a primary winding, and each sharing a common secondary winding;

switching means for (1) selectively rendering ineffective either one or a combination of said plurality of primary windings, and (2) periodically applying said direct voltage across the remaining ones of said plurality of primary windings for causing pulses of current to flow through these windings in a given direction, thereby causing voltage pulses of desired amplitude, polarity, and duration to be induced into said secondary winding; and control means for operating said switching means at a predetermined frequency and responsive to the output signals from said plurality of comparator means, respectively, for producing said voltage pulses in said secondary winding at said predetermined frequency and amplitude modulated in correspondence with said command signal.

16. The amplitude modulated power supply of claim 15 further including second rectifier means connected to said secondary winding for rectifying said amplitude modulated voltage pulses to produce a DC output voltage that is a discrete amplitude modulated DC representation of said AC command signal, whereby each discrete voltage level of said amplitude modulated DC output voltage represents an instant amplitude value of said command signal.

17. The amplitude modulated power supply of claim 15, wherein said plurality of transformers are each provided by laminated cores for switching frequencies below 2 kHz, tape wound cores for frequencies from about 2 kHz to 20 kHz, and ferrite cores of either toroidal, pot, or E-core configuration for frequencies about 20 kHz.

* * * * *